(12) United States Patent
Choi et al.

(10) Patent No.: US 12,237,426 B2
(45) Date of Patent: Feb. 25, 2025

(54) FLOATING GATE BASED 3-TERMINAL ANALOG SYNAPSE DEVICE

(71) Applicant: KOREA ADVANCED INSTITUTE OF SCIENCE AND TECHNOLOGY, Daejeon (KR)

(72) Inventors: Shinhyun Choi, Daejeon (KR); Beomjin Kim, Daejeon (KR); Tae Ryong Kim, Daejeon (KR); See On Park, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 574 days.

(21) Appl. No.: 17/553,109

(22) Filed: Dec. 16, 2021

(65) Prior Publication Data

US 2022/0285546 A1   Sep. 8, 2022

(30) Foreign Application Priority Data

Mar. 2, 2021 (KR) .......................... 10-2021-0027128
Nov. 17, 2021 (KR) .......................... 10-2021-0158208

(51) Int. Cl.
*H01L 29/788* (2006.01)
*G06F 17/16* (2006.01)
(Continued)

(52) U.S. Cl.
CPC ............ *H01L 29/788* (2013.01); *G11C 16/24* (2013.01); *H01L 29/42324* (2013.01);
(Continued)

(58) Field of Classification Search
CPC ......... G06F 17/16; G11C 16/14; G11C 16/24; G11C 16/26; H01L 29/788;
(Continued)

(56) References Cited

U.S. PATENT DOCUMENTS

2008/0237694 A1* 10/2008 Specht ................. H01L 29/513
257/E21.423
2009/0134453 A1* 5/2009 Govoreanu ......... H01L 29/7881
257/326

(Continued)

FOREIGN PATENT DOCUMENTS

JP    11-177034      7/1999
JP    2007-318138    12/2007
(Continued)

OTHER PUBLICATIONS

Yoeri van de Burgt et al., "A non-volatile organic electrochemical device as a low-voltage artificial synapse for neuromorphic computing", *Nature Materials*, Apr. 2017, vol. 16, 414-419, 6 pages.

(Continued)

*Primary Examiner* — Alonzo Chambliss

(57) ABSTRACT

Provided is a floating gate based 3-terminal analog synapse device including a silicon channel layer; a gate oxide deposited on the silicon channel layer; a charge trap layer deposited on the gate oxide, wherein charges are injected into the charge trap layer; a barrier layer deposited on the charge trap layer, and having lower electron affinity than electron affinity of a material of the charge trap layer; and a (Continued)

gate metal layer deposited on an upper surface of the barrier layer, wherein a gate voltage is applied to the gate metal layer.

19 Claims, 20 Drawing Sheets

(51) Int. Cl.
| | |
|---|---|
| *G11C 16/14* | (2006.01) |
| *G11C 16/24* | (2006.01) |
| *G11C 16/26* | (2006.01) |
| *H01L 29/423* | (2006.01) |
| *H01L 29/49* | (2006.01) |
| *H01L 29/66* | (2006.01) |
| *H01L 29/792* | (2006.01) |

(52) U.S. Cl.
CPC ...... *H01L 29/4234* (2013.01); *H01L 29/4966* (2013.01); *H01L 29/66825* (2013.01); *H01L 29/792* (2013.01); *G06F 17/16* (2013.01); *G11C 16/14* (2013.01); *G11C 16/26* (2013.01)

(58) Field of Classification Search
CPC ........... H01L 29/4234; H01L 29/42324; H01L 29/4966; H01L 29/792; H01L 29/66825
See application file for complete search history.

(56) References Cited

U.S. PATENT DOCUMENTS

| | | | |
|---|---|---|---|
| 2009/0175089 A1* | 7/2009 | Eitan ..................... | H01L 29/792 |
| | | | 365/185.28 |
| 2011/0183509 A1* | 7/2011 | Govoreanu ....... | H01L 29/40114 |
| | | | 438/591 |
| 2016/0268418 A1* | 9/2016 | Lee ....................... | H01L 29/685 |
| 2022/0270676 A1* | 8/2022 | Choi ................. | H01L 29/40114 |

FOREIGN PATENT DOCUMENTS

| | | |
|---|---|---|
| JP | 4768427 | 9/2011 |
| KR | 10-2008-0082358 | 9/2008 |
| KR | 10-0994451 | 11/2010 |
| KR | 10-2017-0034215 | 3/2017 |
| KR | 10-2017-0034290 | 3/2017 |
| KR | 10-2020-0115722 | 10/2020 |

OTHER PUBLICATIONS

Chuan Qian et al., "Artificial Synapses Based on in-Plane Gate Organic Electrochemical Transistors", *ACS Applied Materials &Interfaces*, 2016, 8, 26169-26175, 7 pages.

Jing-Ting Yang et al., "Artificial Synapses Emulated by an Electrolyte-Gated Tungsten-Oxide Transistor", *Advanced Materials*, 2018, 1801548, 10 pages.

Yoeri van de Burgt et al., "A non-volatile organic electrochemical device as a low-voltage artificial synapse ror neuromorphic computing", *Nature Materials*, Apr. 2017, vol. 16, 414-419, 6 pages.

* cited by examiner

Variation from 18 memristors $X_{BL} < X_{CSL}, X_{GM}$

1. Mesa Structured SOI

2. PECVD SiO2 deposition for gate oxide

3. Barrier layer / Charge store layer deposition

4. Gate stack isolation with Reactive Ion Etcher

5. Source/Drain activation

6. Metal PAD deposition

1. Mesa Structured SOI

2. PECVD SiO2 deposition for gate oxide

3. CSL deposition

4. CSL Etch

5. Barrier layer deposition

6. Barrier layer etch

7. Source/Drain activation

8. Metal PAD deposition

Patterned PR

CSL deposition

PR removal (Lift-off)

FLOATING GATE BASED 3-TERMINAL ANALOG SYNAPSE DEVICE

CROSS-REFERENCE TO RELATED APPLICATION

This application claims priority of Korean Patent Application No. 10-2021-0027128, filed on Mar. 2, 2021, and priority of Korean Patent Application No. 10-2021-0158208, filed on Nov. 17, 2021, in the KIPO (Korean Intellectual Property Office), the disclosure of which is incorporated herein entirely by reference.

BACKGROUND OF THE INVENTION

Field of the Invention

The present disclosure relates to an analog synapse device and a manufacturing method thereof, and more particularly, to a floating gate based 3-terminal analog synapse device which variously controls the operating current range by adjusting the doping concentration of source-drain channel, has high computation processing efficiency, thereby achieving efficient machine learning and deep learning computation with the reduced size and power consumption of a neural network based computing system, forms a charge trap layer and a barrier layer in different sizes, and simplifies a manufacturing process by applying the lift-off technique, and a manufacturing method thereof.

Description of the Related Art

In general, a semiconductor device that performs artificial intelligence computing in an artificial intelligence computer is referred to as a neuromorphic chip, and it is a semiconductor device that directly mimics the human brain consisting of networks of synapses and neurons, which are known as the best fit for artificial intelligence computing.

In particular, a neuromorphic device based on a complementary metal-oxide-semiconductor (CMOS) based hardware performs artificial intelligence computing very efficiently, but has the limited integrity and universality in the long term due to inefficiency of the device structure. Therefore, attention is paid to a synapse device for efficiently implementing a neuromorphic chip such as a memristor and a synaptic transistor.

Here, the 'synapse device' refers to a device mimicking biological synaptic functionality.

A neuron or nerve cell of the brain plays an essential role in recognizing and processing information acquired through the human sense organs.

A single neuron usually has a plurality of synapses which connect the neuron to other neurons.

This operation between neurons may have energy efficient and parallel information processing and learning functions.

The neurons integrate analog signals at the cell body, and when the sum of the signals is larger than the threshold voltage, action potentials having the width of approximately 1 ms and almost uniform intensity are generated, and this may be understood as pulse signals of a digital concept.

Accordingly, the synapse device mimicking the synapses needs to change its weight for input, and the weight may be implemented as the amount of charges stored in a charge trap layer of a memory layer FIG. 1 is a diagram showing irregular filament formation of a memristor according to the related art.

FIG. 2 is a graph showing a change in electrical conductivity of the memristor shown in FIG. 1.

FIG. 3 is a graph showing a change in conductance and post-synapse current as a function of a change in pulse number in the memristor according to the related art.

As shown in FIG. 1, in the case of an analog synapse device used in a neuromorphic chip for computing system such as a memristor, a filament is irregularly formed in amorphous materials.

Additionally, a neuron has both memory and processor functions, and when frequent stimuli are applied to a pre-synapse, electrical conductivity of a post-synapse increases and sensitivity to the stimuli increases, and when stimuli are occasionally applied, electrical conductivity decreases and sensitivity to the stimuli decreases.

That is, as shown in FIG. 2, the memristor according to the related art has a nonlinear current change according to Long Term Potentiation—Long Term Depression (LTP-LTD) switching characteristics through potentiating pulses—depressing pulses applied during 0~100 pulses across 18 memristors.

However, nonlinearity changes the amount of charges (or the number of pulse) necessary for desired weight updates depending on conductance which is the current resistance state of the device, i.e., the weight of machine learning computation, resulting in reduced operational reliability of the device.

Additionally, to determine the number of pulses to be applied, it is necessary to identify the current state of the device, so it is unavoidable to additionally perform a read operation, resulting in the increased overall operation time of the memristor based system and the performance degradation of the device.

To overcome these problems, some related arts exhibit linearity and symmetry in the LTP-LTD switching characteristics using 3-terminal based synaptic transistors, but in the case of such devices, the on/off ratio is low or the pulse duration for operation is too long, so it is not suitable for use in Processing In Memory (PIM) computing. Furthermore, the size of the device increases (about 103um2), which makes circuit integration difficult.

Here, 'Processing In Memory' refers to data processing for data storage and computation in a single memory device to reduce the fabrication cost and increase the computation processing rate.

That is, as shown in the upper part of FIG. 3, the memristor according to the related art changes in conductance during 0~15,000 pulses, and as shown in the lower part of FIG. 3 which is an enlarged diagram of section A in the upper part of FIG. 3, the pre-synapse voltage toggles between −1 mV and +1 mV during about 4,000~5,500 pulses, and the conductance changes in the shape of triangular pulse having a nonlinear waveform as shown in section B under the maintained post-synapse voltage 100 mV.

In this instance, the pulse width is as long as about 1 sec, and as shown in section B, the ratio of turn on to turn off, called on/off ratio, is as low as about '2' or less.

Accordingly, due to relative low linearity and symmetry on the graph of LTP-LTD switching operation, it is not suitable for use in an analog synapse device for neuromorphic computing.

Meanwhile, in the case of the existing synapse device utilizing a threshold voltage conversion layer (TL), which is formed as a metal oxide based resistive switching layer or a PN diode, for controlling the charge injection through the gate, there are weakness such as integration area caused by required additional transistor for accessing each synapse device to read, write and erase operation.

Additionally, when the switching layer is formed as a metal oxide based resistive switching layer, there is a risk that an error may occur in resistance change between each devices or each operations, due to the low reliability characteristics of the metal oxide based resistive switching layer.

Additionally, when the switching layer is formed as a PN diode, it is unavoidable to perform ion implantation and anneal process for forming the PN diode, so the manufacturing process becomes complex, integration level reduces, and the life of the device is shortened by degradation caused by impacts applied to the PN diode during the charge injection due to the use of the reverse bias above the breakdown voltage.

SUMMARY OF THE INVENTION

The present disclosure is directed to providing a floating gate based 3-terminal analog synapse device capable of read operation, write operation and erase operation with linear conductance update and low power by controlling the operating current range by adjusting the doping concentration of source-drain channel.

The present disclosure is further directed to providing a floating gate based 3-terminal analog synapse device which is compatible with a complementary metal-oxide-semiconductor (CMOS) device using the existing CMOS fabrication process and is suitable for mass production, and reduces the size when integrated into a chip with CMOS device based peripheral circuits and power consumption of the entire neural network based computing system and provides high computation processing efficiency, thereby achieving efficient machine learning and deep learning computation in an edge device.

The present disclosure is further directed to providing a floating gate based 3-terminal analog synapse device in which a charge trap layer and a barrier layer are formed in different sizes by performing each of deposition and etching of these two layers through individual processes, and the lift-off technique can be applied instead of the etching-based process to simplify the manufacturing process.

The present disclosure is further directed to providing a method for manufacturing a floating gate based 3-terminal analog synapse device for the achieving the above-described object.

To solve the above-described problem, the present disclosure provides a floating gate based 3-terminal analog synapse device including a silicon channel layer, a gate oxide deposited on the silicon channel layer, a charge trap layer where charges are injected from the gate deposited on the gate oxide, a barrier layer having lower electron affinity than electron affinity of a material of the charge trap layer deposited on the charge trap layer, and a gate metal layer where a gate voltage is applied deposited on an upper surface of the barrier layer.

In an embodiment of the present disclosure, each of a potential barrier height between the gate metal layer and the barrier layer and a potential barrier height between the barrier layer and the charge trap layer has a lower barrier height than 2 eV.

In an embodiment of the present disclosure, in case that a negative voltage is applied to the gate metal layer, the charges are injected into the charge trap layer, and in case that a positive voltage is applied to the gate metal layer, the charges are removed from the charge trap layer.

In an embodiment of the present disclosure, the floating gate based 3-terminal analog synapse device comprises a source including a source electrode formed in a first region on the silicon channel layer, spaced apart from the region under the gate oxide layer, and a drain including a drain electrode formed in a second region on the silicon channel layer, spaced apart from the region under the gate oxide layer.

In an embodiment of the present disclosure, a conductance change is read by determining a current value between source-drain according to an amount of accumulated charges of the charge trap layer.

In an embodiment of the present disclosure, in case of a write operation or erase operation of the synapse device, charge injection or removal is done from the gate metal layer to the charge trap layer using a potential difference between the source-drain channel and the gate metal layer, and in case of a read operation of the synapse device, after grounding or floating the gate metal layer, an output current is read using the voltage applied between source-drain and the read change in conductance.

In an embodiment of the present disclosure, the silicon channel layer is isolated, a selector device is formed on any one of the first region or the second region, and the selector device includes same materials of a charge trap layer, a barrier layer and a source or drain electrode.

In an embodiment of the present disclosure, the gate oxide is stacked using at least one material selected from Si oxide, Si nitride, SiOxNy, Hf oxide and Ta oxide by at least one method selected from thermal oxidation, chemical vapor deposition (CVD) and atomic layer deposition (ALD), and the charge trap layer includes at least one selected from W oxide, Mo oxide, In oxide, V oxide and ITO.

In an embodiment of the present disclosure, the barrier layer includes at least one selected from amorphous silicon, hydrogenated amorphous silicon, Si oxide, Ti oxide, Ta oxide, Hf oxide, Si nitride, SiOxNy, Al oxide, Zr oxide, Zn oxide, Nb oxide and FTO.

Additionally, the present disclosure provides a floating gate based 3-terminal analog synapse device array comprising a plurality of cells, wherein in case that the synapse device is manufactured in an array, the selector device interrupts a sneak path flow of current in neighboring synapse devices by reverse bias, and wherein input voltage pulses applied to a plurality of bit lines of the synapse device array pass through each of the plurality of cells which have a gate terminal respectively connected to a plurality of word lines, and are converted into electric currents flowing in a plurality of source lines perpendicular to the plurality of bit lines by conductance stored in each cell.

Further, the converted electric currents from cells flows to a connected common source line, and are combined into an output current value of the common source line with the currents from other cells sharing common source line to perform vector-matrix multiplication.

Details of other embodiments are included in the "best mode" and the accompanying "drawings".

The advantages and/or features of the present disclosure and methods for achieving them will be apparent by referring to the following embodiments described in detail together with the accompanying drawings.

However, the present disclosure is not limited to the subject matter of each disclosed embodiment, and may be embodied in a variety of different forms, and each embodiment disclosed herein is provided so that this disclosure will be thorough and complete and will fully convey the scope of the present disclosure to those skilled in the art, and it should be noted that the present disclosure is defined by each claim of the appended claims.

According to the present disclosure, it is possible to ensure carrier injection and removal according to gate voltage, leading to a linear change of electric current through source-drain channel under same bias. Further, this operations do not rely on the charge injection through the silicon oxide layer between gate and channel, so there is no degradation of the silicon oxide layer caused by electrons, thereby improving durability and stability of the device.

Additionally, as carrier injection and removal are done all over the charge trap layer, the operational stability is improved compared to the existing filament based memristor synapse device.

Additionally, when configured using a system on chip for computing to imitate neural networks, it is possible to reduce power consumption compared to the existing complementary metal-oxide-semiconductor (CMOS) based neural network processing device, and thus can be used in an edge device.

Additionally, as data storage is performed in a single device, high density integration is achieved, and mass production is possible because of capability of utilizing the existing CMOS based manufacturing process, thereby achieving cost savings, and it can be used to build a cloud server for training neural networks.

Additionally, as each of deposition and etching of the charge trap layer and the barrier layer is performed through individual processes, it is possible to form these two layers in different sizes.

Additionally, the lift-off technique can be applied to the silicon channel layer and the gate oxide stack, thereby simplifying the manufacturing process and preventing film surface damage that may occur in the etching process.

BRIEF DESCRIPTION OF THE DRAWINGS

The above and other features and advantages will become more apparent to those of ordinary skill in the art by describing in detail exemplary embodiments with reference to the attached drawings, in which.

In the following description, the same or similar elements are labeled with the same or similar reference numbers.

DETAILED DESCRIPTION

Figure 1:
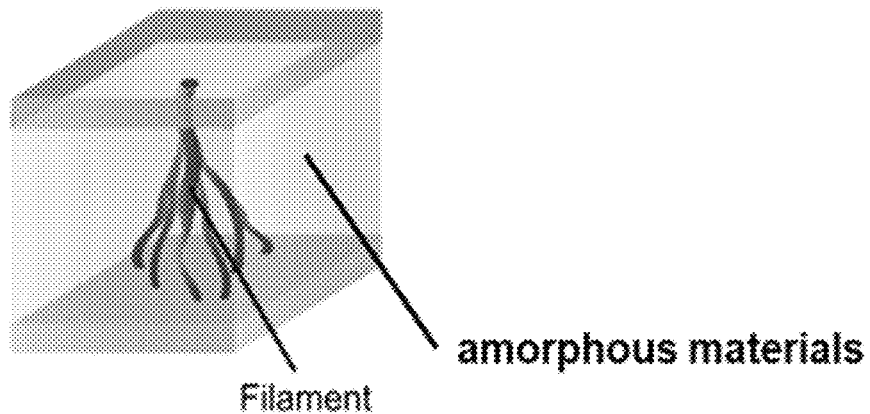
FIG. 1 is a diagram showing random filament formation of a memristor according to the related art.
Figure 2:
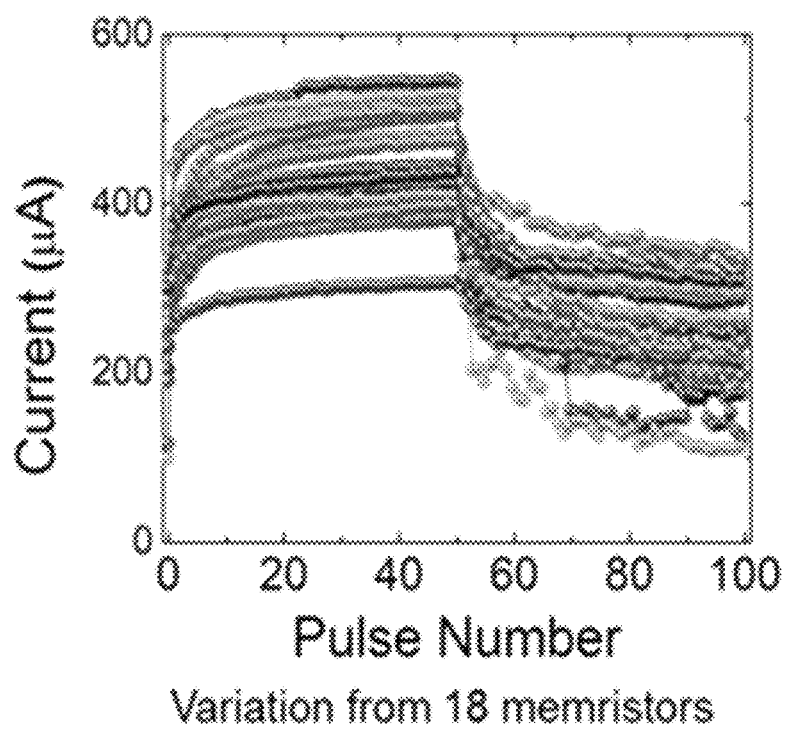
FIG. 2 is a graph showing a change in electrical conductivity of the memristor shown in FIG. 1 by applied pulse number.
Figure 3:
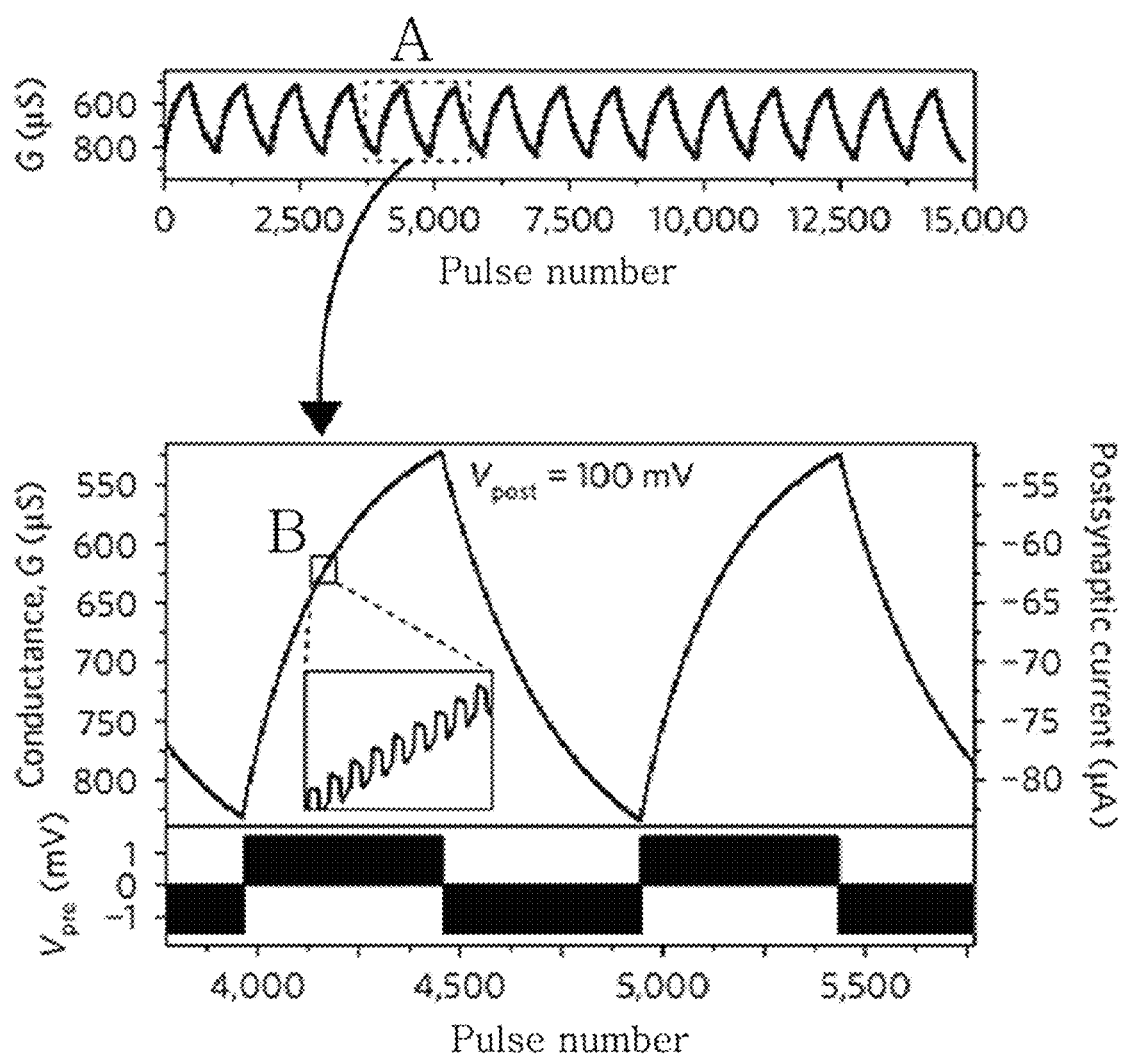
FIG. 3 is a graph showing a change in conductance and post-synapse current as a function of pulse number applied to a memristor according to the related art.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes", "comprises" and/or "comprising," when used in this specification, specify the presence of stated features, integers, steps, operations, elements, and/or components, but do not preclude the presence or addition of one or more other features, integers, steps, operations, elements, components, and/or groups thereof. In addition, a term such as a "unit", a "module", a "block" or like, when used in the specification, represents a unit that processes at least one function or operation, and the unit or the like may be implemented by hardware or software or a combination of hardware and software.

Reference herein to a layer formed "on" a substrate or other layer refers to a layer formed directly on top of the substrate or other layer or to an intermediate layer or intermediate layers formed on the substrate or other layer. It will also be understood by those skilled in the art that structures or shapes that are "adjacent" to other structures or shapes may have portions that overlap or are disposed below the adjacent features.

In this specification, the relative terms, such as "below", "above", "upper", "lower", "horizontal", and "vertical", may be used to describe the relationship of one component, layer, or region to another component, layer, or region, as shown in the accompanying drawings. It is to be understood that these terms are intended to encompass not only the directions indicated in the figures, but also the other directions of the elements.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Preferred embodiments will now be described more fully hereinafter with reference to the accompanying drawings. However, they may be embodied in different forms and should not be construed as limited to the embodiments set forth herein. Rather, these embodiments are provided so that this disclosure will be thorough and complete, and will fully convey the scope of the disclosure to those skilled in the art.

Figure 4:
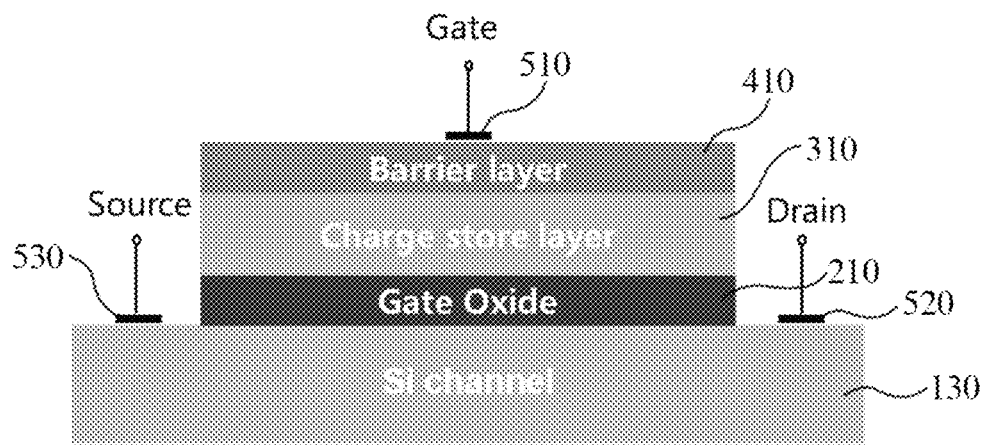
FIG. 4 is a cross-sectional view showing a floating gate based 3-terminal analog synapse device according to a first embodiment of the present disclosure.

FIG. 4 is a cross-sectional view showing a floating gate based 3-terminal analog synapse device according to a first embodiment of the present disclosure.

Figure 5A:
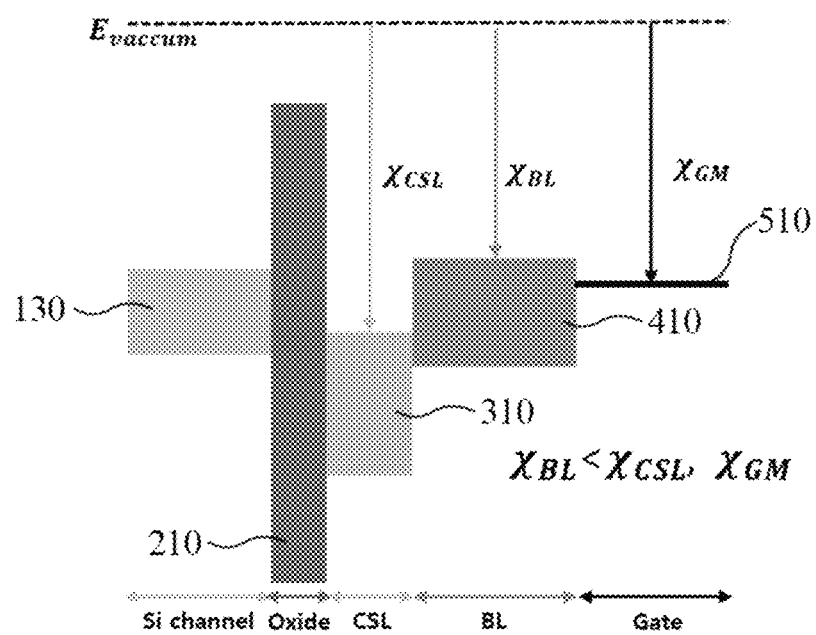
FIGS. 5A to 5C are band diagrams showing the charge movement according to electron affinity of each element of the synapse device shown in FIG. 4 and the sign of gate voltage.
Figure 5B:
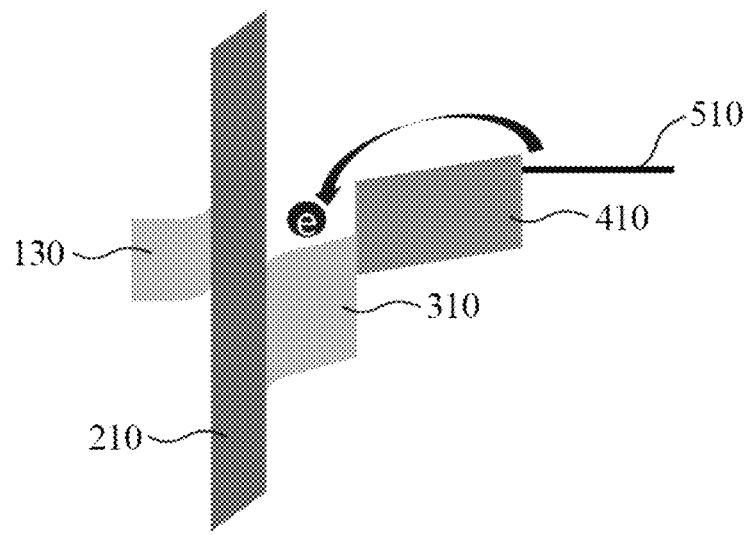
Figure 5C:
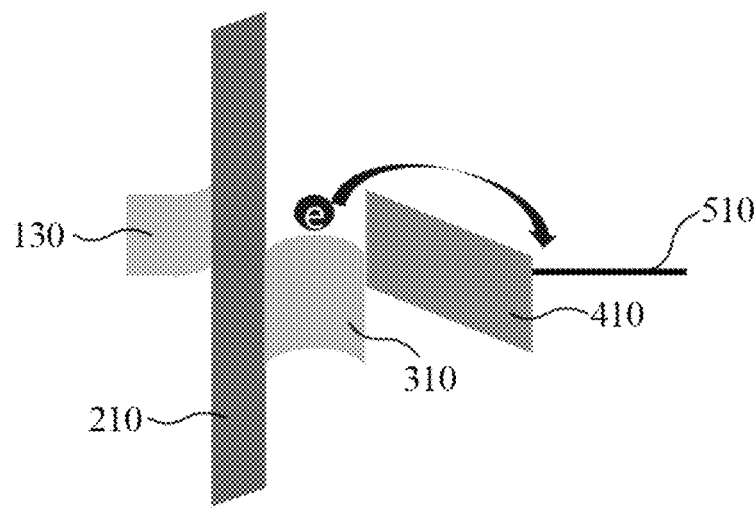

FIGS. 5A to 5C are band diagrams showing the charge movement according to electron affinity of each element of the synapse device shown in FIG. 4 and the sign of gate voltage.

Figure 6:
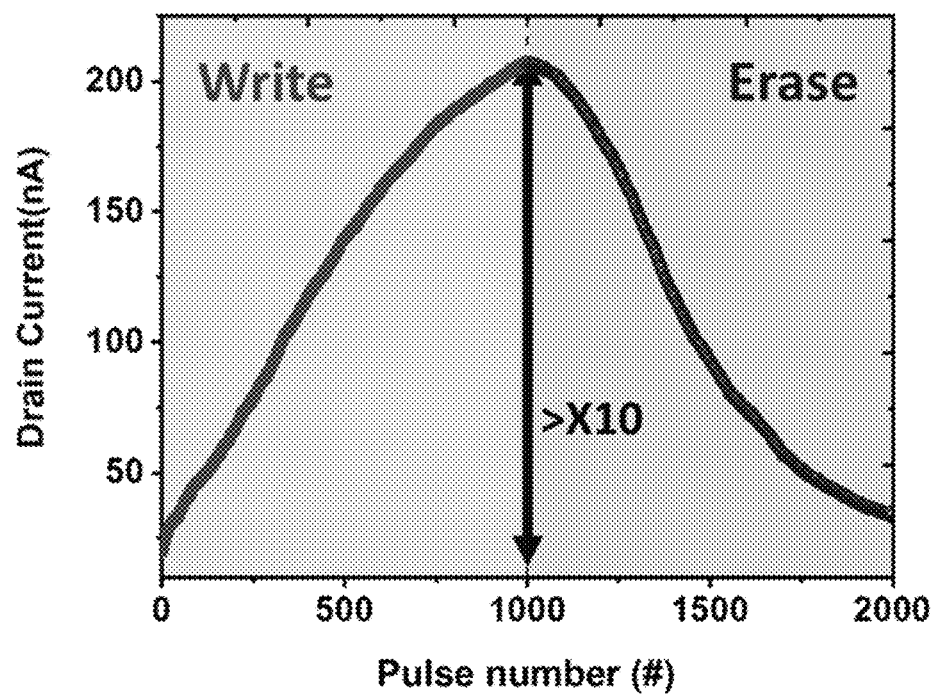
FIG. 6 is a graph showing a change in electrical conductivity of the synapse device shown in FIG. 4.

FIG. 6 is a graph showing a change in electrical conductivity of the synapse device shown in FIG. 4.

Referring to FIG. 4, the analog synapse device according to the first embodiment of the present disclosure includes a silicon channel layer 130, a gate oxide 210 stacked on the silicon channel layer 130, a charge trap layer 310 stacked on the upper surface of the gate oxide 210, and a barrier layer 410 stacked on the upper surface of the charge trap layer 310. In an embodiment of the present disclosure, the gate oxide is stacked apart from a first region and a second region corresponding to source and drain regions of the silicon channel layer. Additionally, a gate metal layer 510 is formed on the upper surface of the barrier layer 410, and a source layer 530 and a drain layer 520 are formed in the first region and the second region formed on two sides of the upper surface of the silicon channel layer 130, respectively.

In particular, the present disclosure pays attention to electron affinity between materials and a potential barrier obtained therefrom, and in an embodiment of the present disclosure, the charge trap layer 310 uses a material having high electron affinity such as $WO_3$, $MoO_3$, $In_2O_3$, $V_2O_5$, and the barrier layer 410 of a material having lower electron affinity than the charge trap layer 310 is used between the charge trap layer 310 and the gate metal 510. The material of the barrier layer 410 may include Au, Pd, Pt, Ag, W, Al, Cu, Ru, Co, Ti, TiN, Ta, TaN, but the scope of the present disclosure is not limited thereto, and the scope of the present disclosure covers any material having electron affinity which is at least lower than the charge trap layer 310 and causing a potential barrier between the gate metal and the barrier layer to be equal to or less than 3 eV and a potential barrier between the barrier layer and the charge trap layer to be equal to or less than a predetermined level (3 eV) as described below.

Accordingly, the barrier layer 410 of low electron affinity allows charges to easily move to the charge trap layer 310 and be stored in the charge trap layer 310, and lowers the barrier with the gate metal layer 510 as well. Using this, the floating gate based 3-terminal analog synapse device according to the present disclosure performs charge injection and removal from the gate metal layer 510 to the charge trap layer, and the depletion region of the source-drain channel below the gate is changed by the amount of injected charges, and under the same applied voltage, the current value between source-drain changes and this is recognized as a conductance change and read out, and through this, the analog synapse device operates.

In an embodiment of the present disclosure, each of the potential barrier height between the gate metal layer and the barrier layer and the potential barrier height between the barrier layer 410 and the charge trap layer 310 is lower than 3 eV, and when the potential barrier is higher than 3 eV, a charge trapping phenomenon occurs and the synapse device loses linearity that is very important to the synapse device.

Hereinafter, a method for operating a device according to the present disclosure will be described using the device of FIGS. 4 and 5. However, the scope of the present disclosure is not limited to the structure of the following embodiment, and any device which is operated by the above-described method through the barrier material of at least low electron affinity falls within the scope of the present disclosure.

The operation of the floating gate based 3-terminal analog synapse device according to the first embodiment of the present disclosure will be briefly described with reference to FIGS. 4 and 5 below.

In the case of the present disclosure, a material having high electron affinity is used for the charge trap layer 310, and the barrier layer 410 between the charge trap layer 310 and the gate metal layer 510 has a value of lower electron affinity than the charge trap layer 310 to allow charges to be stored in the charge trap layer 310.

At the same time, the barrier layer 410 has a value of electron affinity that lowers the barrier with the gate metal layer 510, which makes charge movement easy.

Using this, carrier (charge) injection and removal is done from the gate metal layer 510 to the charge trap layer 310.

The depletion region of the source-drain channel below the gate is changed by the amount of injected carriers, and under the same applied voltage, the current value between source-drain changes and this is recognized as a change in conductance, and through this, the analog synapse device operates.

That is, in the case of write operation or erase operation, carrier injection or removal is done from the gate metal layer 510 to the charge trap layer 310 using a potential difference between the channel between source-drain and the gate metal layer 510.

In the case of read operation, after grounding GND or floating the gate metal layer 510, the output electric current is read by the applied voltage between source-drain to read a change in channel conductance with a change in depletion region of the channel between source-drain caused by the charges stored in the charge trap layer 310.

Accordingly, the conductance of source-drain channel linearly changes in an analog form according to the pulses applied in the write or erase operation.

Through this, as shown in FIGS. 5A to 5C, the present disclosure accomplishes carrier injection and removal through low barrier height according to the applied gate voltage, leading to a linear change of electric current of the source-drain channel below the gate.

As opposed to the operation of the existing floating gate based synapse device, it does not rely on electrons moving through the silicon oxide layer between gate and channel, thereby preventing the degradation of the silicon oxide layer caused by the charge movement through the silicon oxide layer and improving the durability of the device.

Additionally, carrier injection and removal are done all over the charge trap layer 310, resulting in stable operation compared to the existing filament based memristor synapse device.

As shown in FIG. 6, as a result of measuring the analog synapse device of the present disclosure after 1000 long term potentiation—1000 long term depression switching, repeated operations are possible, and compared to the existing synapse device with the pulse width of about 1 sec, the pulse width is as short as 500 µs, and a ratio of maximum/minimum values of conductance is '10' or more.

Accordingly, linearity and symmetry are significantly improved on the graph of the long term potentiation—long term depression switching operation, so the amount of charges (or the number of pulses) necessary for desired weight updates is constantly maintained by a reduced correlation with the current conductance level which is the current resistance state of the device.

Additionally, to determine the number of pulses to be applied for weight updates necessary for machine learning computation, it is not necessary to recognize the current state of the device because the amount of pulse number required to update the conductance is not a function of current state, thereby eliminating the need to additionally perform the read operation, so the overall operation time of the device reduces and the reliability of the device improves, resulting in more efficient neuromorphic computing.

Hereinafter, a method for operating a device according to the present disclosure will be described using the device of FIGS. 4 and 5. However, the scope of the present disclosure is not limited to the structure of the following embodiment, and any device which is operated by the above-described method through the barrier material of at least low electron affinity falls within the scope of the present disclosure.

The operation of the floating gate based 3-terminal analog synapse device according to the first embodiment of the present disclosure will be briefly described with reference to FIGS. 4 and 5 below.

In the case of the present disclosure, a material having high electron affinity is used for the charge trap layer 310, and the barrier layer 410 between the charge trap layer 310 and the gate metal layer 510 has a value of lower electron affinity than the charge trap layer 310 to allow charges to be stored in the charge trap layer 310.

At the same time, the barrier layer 410 has a value of electron affinity that lowers the barrier with the gate metal layer 510, which makes charge movement easy.

Using this, carrier (charge) injection and removal is done from the gate metal layer 510 to the charge trap layer 310.

The depletion region of the source-drain channel below the gate is changed by the amount of injected carriers, and under the same applied voltage, the current value between source-drain changes and this is recognized as a change in conductance, and through this, the analog synapse device operates.

That is, in the case of write operation or erase operation, carrier injection or removal is done from the gate metal layer 510 to the charge trap layer 310 using a potential difference between the channel between source-drain and the gate metal layer 510.

In the case of read operation, after grounding GND or floating the gate metal layer 510, the output electric current is read by the applied voltage between source-drain to read a change in channel conductance with a change in depletion region of the channel between source-drain caused by the charges stored in the charge trap layer 310.

Accordingly, the conductance of source-drain channel linearly changes in an analog form according to the pulses applied in the write or erase operation.

Through this, as shown in FIGS. 5A to 5C, the present disclosure accomplishes carrier injection and removal through low barrier height according to the applied gate voltage, leading to a linear change of electric current of the source-drain channel below the gate.

As opposed to the operation of the existing floating gate based synapse device, it does not rely on electrons moving through the silicon oxide layer between gate and channel, thereby preventing the degradation of the silicon oxide layer caused by the charge movement through the silicon oxide layer and improving the durability of the device.

Additionally, carrier injection and removal are done all over the charge trap layer 310, resulting in stable operation compared to the existing filament based memristor synapse device.

As shown in FIG. 6, as a result of measuring the analog synapse device of the present disclosure after 1000 long term potentiation—1000 long term depression switching, repeated operations are possible, and compared to the existing synapse device with the pulse width of about 1 sec, the pulse width is as short as 500 µs, and a ratio of maximum/minimum values of conductance is '10' or more.

Accordingly, linearity and symmetry are significantly improved on the graph of the long term potentiation-long term depression switching operation, so the amount of charges (or the number of pulses) necessary for desired weight updates is constantly maintained by a reduced correlation with the current conductance level which is the current resistance state of the device.

Additionally, to determine the number of pulses to be applied for weight updates necessary for machine learning computation, it is not necessary to recognize the current state of the device because the amount of pulse number required to update the conductance is not a function of current state, thereby eliminating the need to additionally perform the read operation, so the overall operation time of the device reduces and the reliability of the device improves, resulting in more efficient neuromorphic computing.

The method for manufacturing a 3-terminal analog synapse device according to the first and second embodiments of the present disclosure will be described in detail with reference to FIGS. 7A to 7F and FIGS. 9A to 9H below.

First, Si channel isolation is performed in a silicon on insulator (SOI) which is monocrystalline silicon grown on an insulating substrate using mesa structure.

Figure 7A:
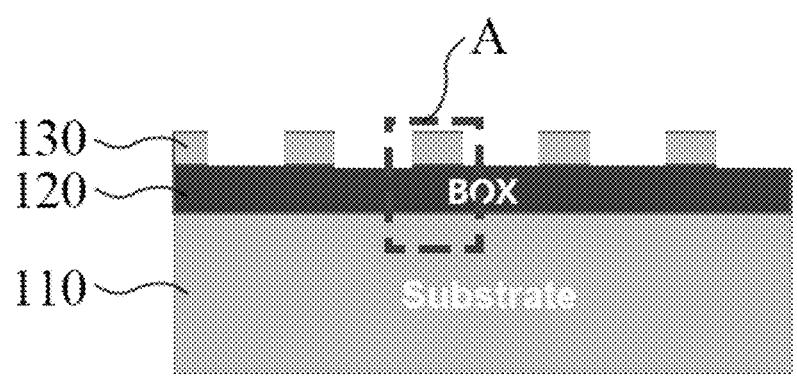
FIGS. 7A to 7F are cross-sectional views for each process for describing a method for manufacturing a 3-terminal analog synapse device according to a first embodiment of the present disclosure.

Here, the mesa structure refers to a pattern having a saw-toothed upper layer generated as shown in FIG. 7A by coating a photoresist to define a predetermined chip area in an integrated circuit with lithography process and removing an unnecessary region using an appropriate etching solution or etching gas.

A substrate layer 110 is formed using silicon.

Figure 7B:
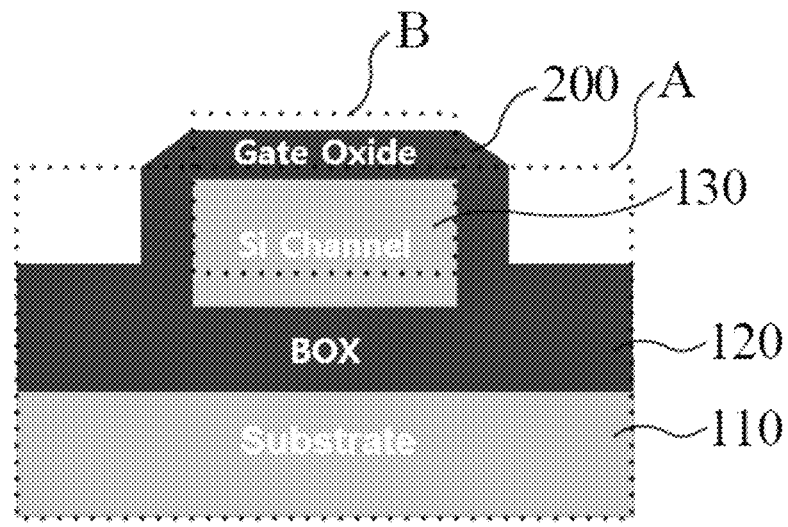

Referring to FIG. 7B which is an enlarged diagram of section A in FIG. 7A showing a deposited gate oxide 200, the gate oxide 200 is deposited on a buried oxide (BOX) layer 120 and a silicon channel layer 130.

That is, to form the gate oxide 200, a SiO$_2$ layer is formed using Plasma Enhanced Chemical Vapor Deposition (PECVD).

Although this embodiment uses the silicon on insulator wafer, this is provided as an example, and a PNP channel or an NPN channel and a buried channel of the existing silicon wafer doping based deposition/enhancement MOSFET may be used. In such a case, for separation of each device, in addition to the mesa structure, LOCal Oxidation of Silicon (LOCOS) or Shallow Trench Isolation (STI) may be used.

The gate oxide layer 200 formed in FIG. 7B is formed using any one material selected from Si oxide, Si nitride, SiOxNy, Hf oxide and Ta oxide by the deposition technique, for example, thermal oxidation, chemical vapor deposition (CVD) and atomic layer deposition (ALD).

Figure 7C:
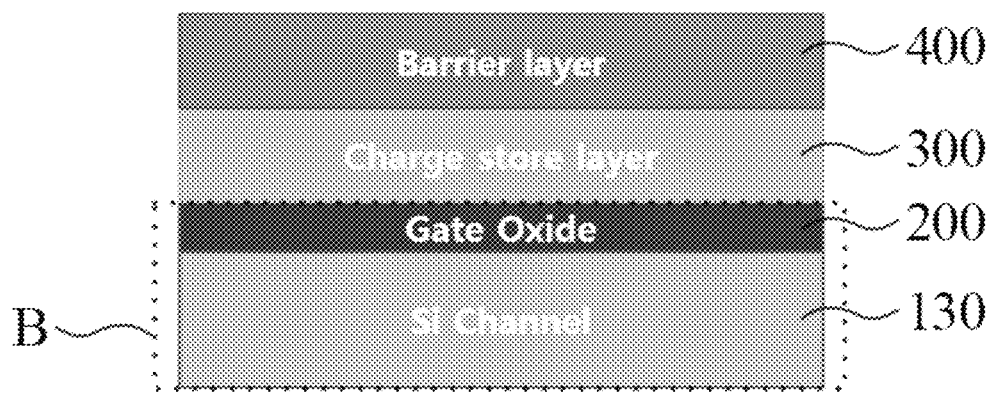

Through this, when the silicon channel layer 130 in FIG. 7B is formed, a charge trap layer 300 and a barrier layer 400 are deposited on the silicon channel layer 130 and the gate oxide 200 stack in a sequential order as shown in FIG. 7C. The charge trap layer 300 is formed using any one material selected from W oxide, Mo oxide, In oxide, V oxide and ITO by the sputtering technique.

The barrier layer 400 is formed using any one material selected from amorphous silicon (a-Si), hydrogenated amorphous silicon (a-Si: H), Si oxide, Ti oxide, Ta oxide, Hf oxide, Si nitride, SiOxNy, Al oxide, Zr oxide, Zn oxide, Nb oxide and FTO by ALD, CVD, sputtering and electron beam evaporation.

In this instance, these materials used in the barrier layer 400 have a value of lower electron affinity than the charge trap layer 300 to allow charges to be stored in the charge trap layer 300, and at the same time, they have a value of electron affinity that lowers the barrier height with the gate metal layer 510 to make it easy to allow charges to move from the charge trap layer 300 to the gate metal layer 510.

That is, as shown in FIG. 5A, the electron affinity of the material used in the barrier layer BL is lower than that of the material of the charge trap layer CSL and the gate metal layer Gate, and thus charges stored in the charge trap layer 310 are kept in the charge trap layer 310.

When a negative voltage is applied to the gate voltage, charges are injected into the charge trap layer 310 as shown in FIG. 5B, and when a positive voltage is applied to the gate voltage, charges are removed from the charge trap layer 310 as shown in FIG. 5C.

In this instance, to maximize the effect of the barrier layer 410 and the charge trap layer 310, the material used in each layer may use two or more materials together.

Additionally, carrier (charge) injection and removal may use thermionic emission, direct tunneling, a type of field emission tunneling, known as Fowler-Nordheim tunneling from the gate metal layer 510 to the charge trap layer 310, and may use band-to-band tunneling between the valance band of the barrier layer 410 and the conduction band of the charge trap layer 310 or trap assisted tunneling may be used.

Through this, the 3-terminal analog synapse device of the present disclosure injects charges using small difference in electron affinity between the barrier layer and the gate metal layer 510, not the resistive switching layer, thereby improving the uniformity.

Figure 7D:
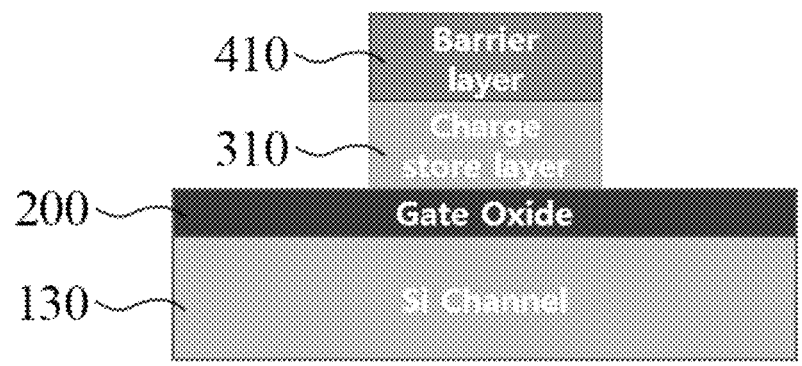

Meanwhile, as shown in FIG. 7D, the first embodiment performs gate stack isolation by etching the two ends of the barrier layer 400 and the charge trap layer 300 of FIG. 7C at the same time using reactive-ion etching (RIE).

Alternatively, as shown in FIGS. 9C to 9F, the second embodiment may differently form the size of the charge trap layer 300 and the size of the barrier layer 400 by forming the charge trap layer 300 through deposition, photolithography and etching first, and then forming the barrier layer 400 through deposition, photolithography and etching.

Figure 7E:
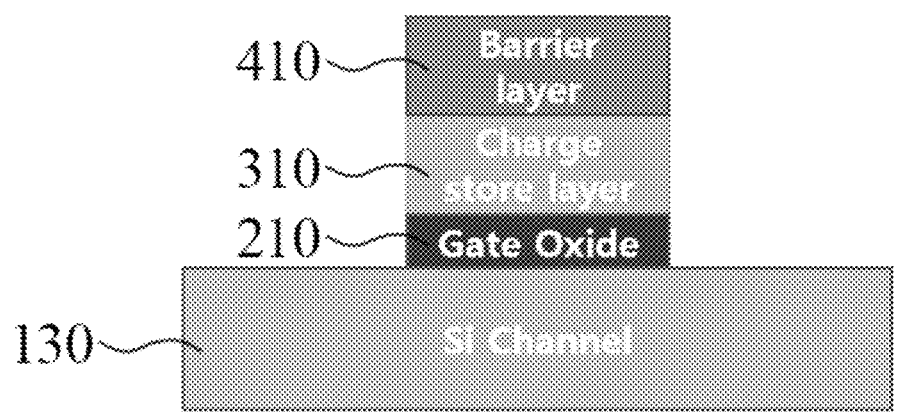

As shown in FIG. 7E, source and drain activation is performed by etching the two ends of the gate oxide 200 of FIG. 7D through wet etching.

Figure 7F:
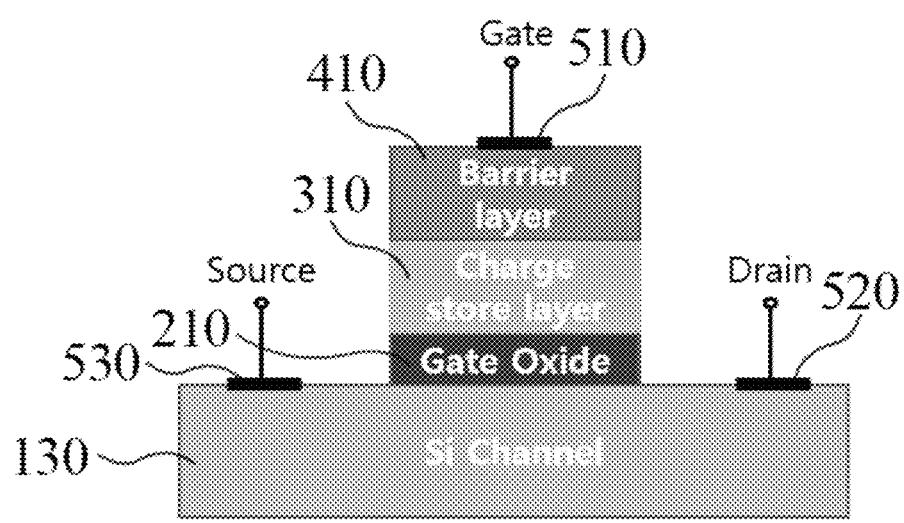
Figure 8:
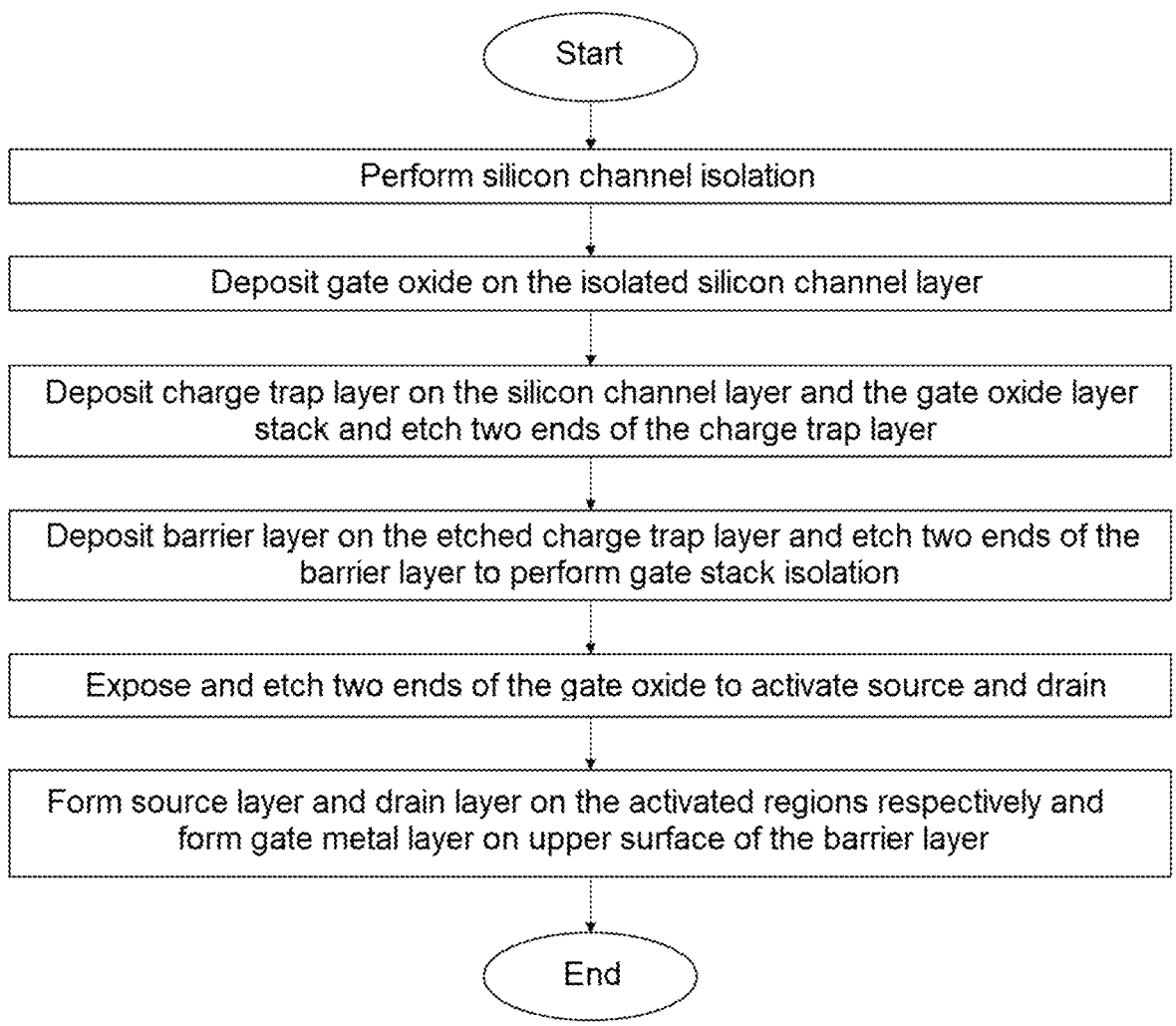
FIG. 8 is a flowchart for describing a process of a method for manufacturing a floating gate based 3-terminal analog synapse device according to a first embodiment of the present disclosure.
Figure 9A:
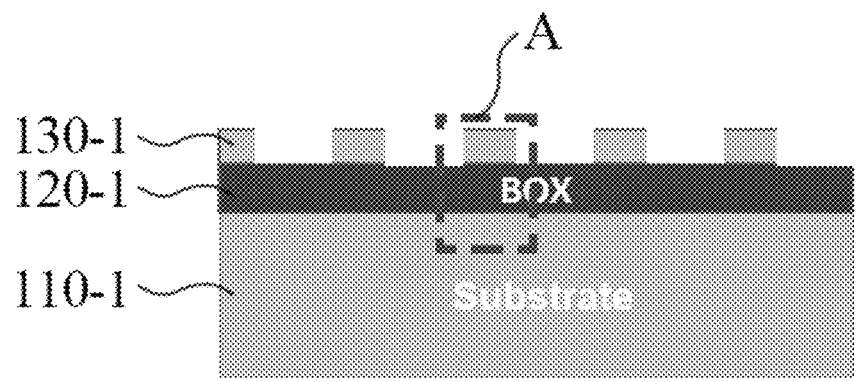
FIGS. 9A to 9H are cross-sectional views for each process for describing a method for manufacturing a 3-terminal analog synapse device according to a second embodiment of the present disclosure.
Figure 9B:
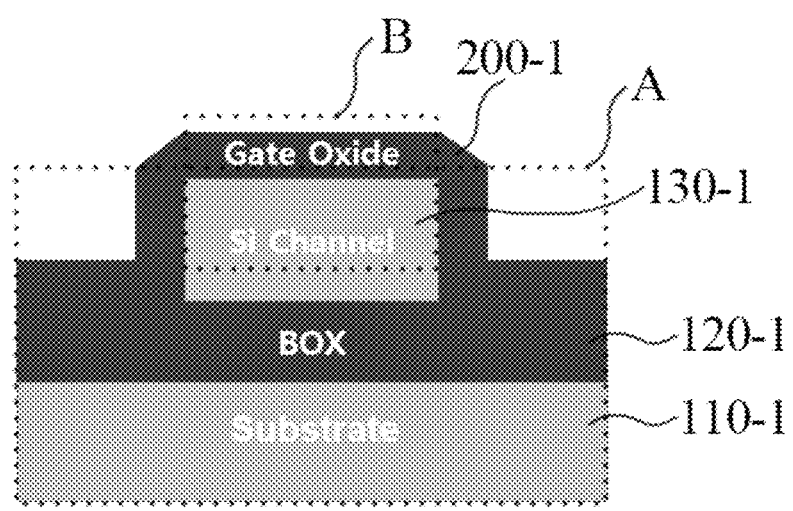
Figure 9C:
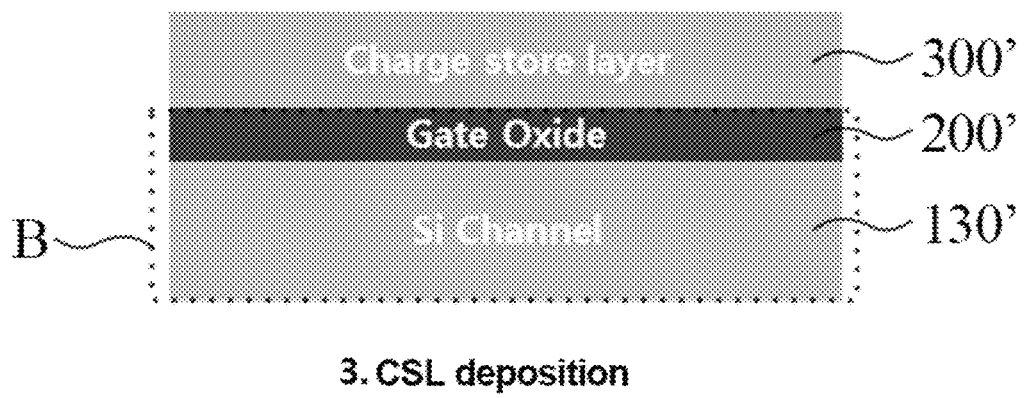
Figure 9D:
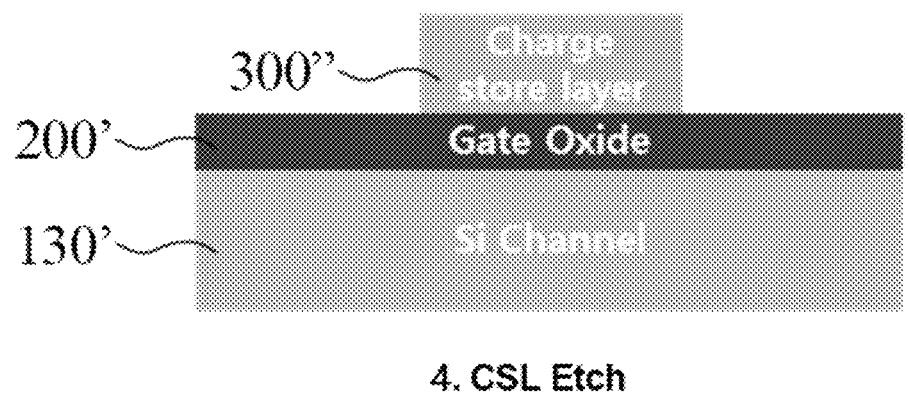
Figure 9E:
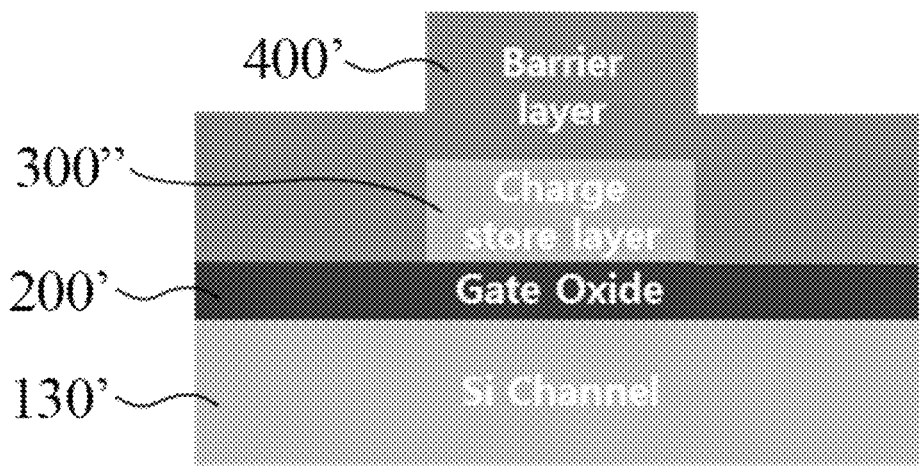
Figure 9F:
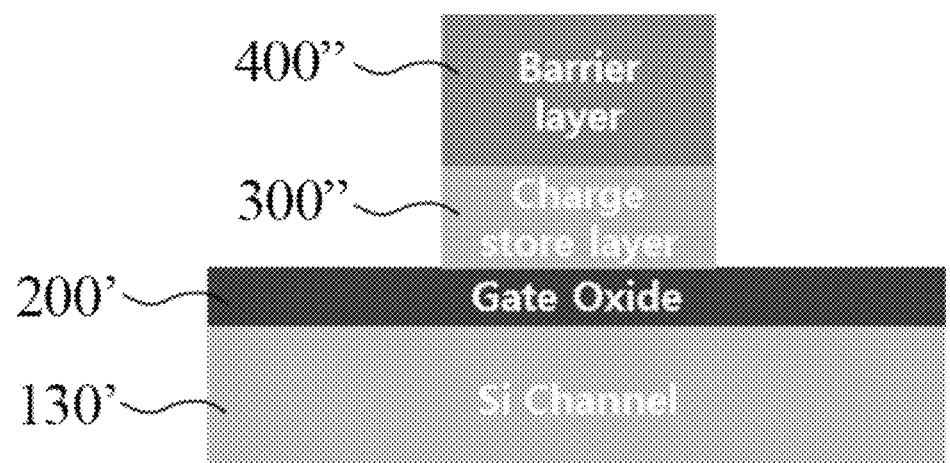
Figure 9G:
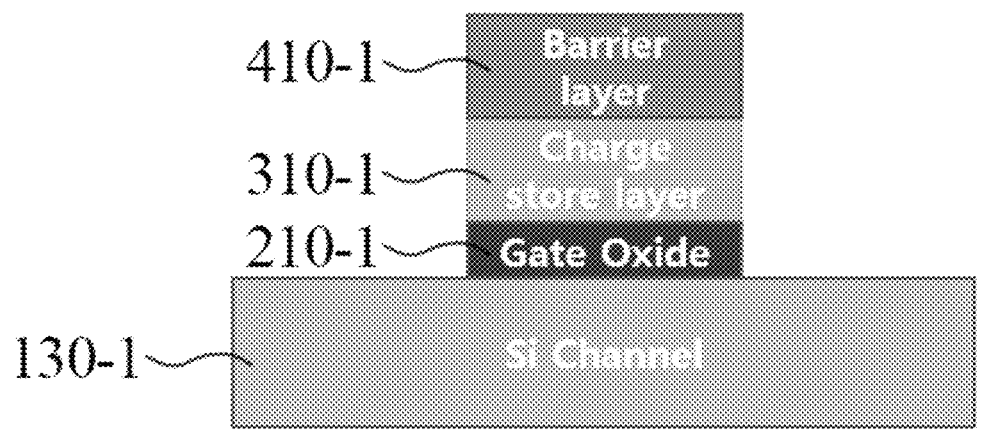
Figure 9H:
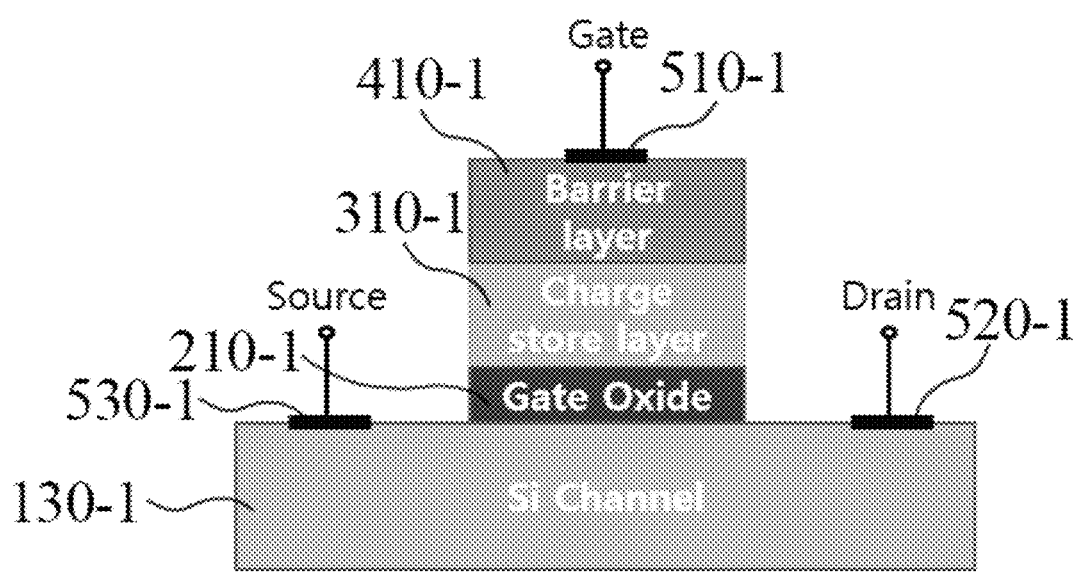

As shown in FIG. 7F, a source layer 530 and a drain layer 520 are formed at the two ends activated on the upper surface of the silicon channel layer 130 respectively, and a gate metal layer 510 is formed at the center of the upper surface of the barrier layer 410.

To this end, any one of electron beam evaporation, thermal evaporation, ALD and sputtering is used.

In particular, the gate metal layer 510 is deposited using any one material selected from Au, Pd, Pt, Ag, W, Al, Cu, Ru, Co, Ti, TiN, Ta, TaN and ITO.

As described above, although the 3-terminal analog synapse device according to the first embodiment of the present disclosure may be manufactured through the process of FIGS. 7A to 7F, instead of the process using etching after deposition of the charge trap layer 300 and the barrier layer 400 like the process of FIGS. 7C to 7E, the second embodiment may use a process using a pattern formed through the lift-off technique after forming a mask like the process of FIGS. 10A to 10D according to the material and method of the charge trap layer 300 and the barrier layer 400.

Figure 10A:
FIGS. 10A to 10D are cross-sectional views for each process for describing a method for implementing the process of FIG. 9D using the lift-off technique in a method for manufacturing a 3-terminal analog synapse device according to a second embodiment of the present disclosure.
Figure 10B:
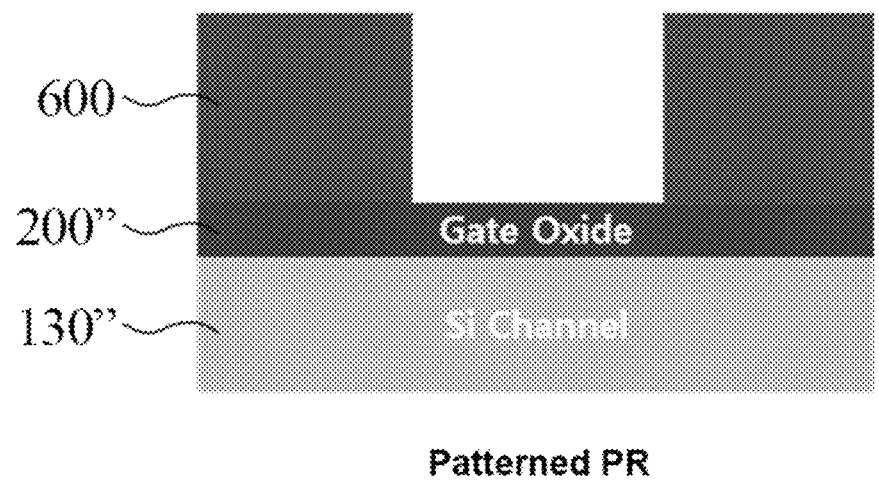
Figure 10C:
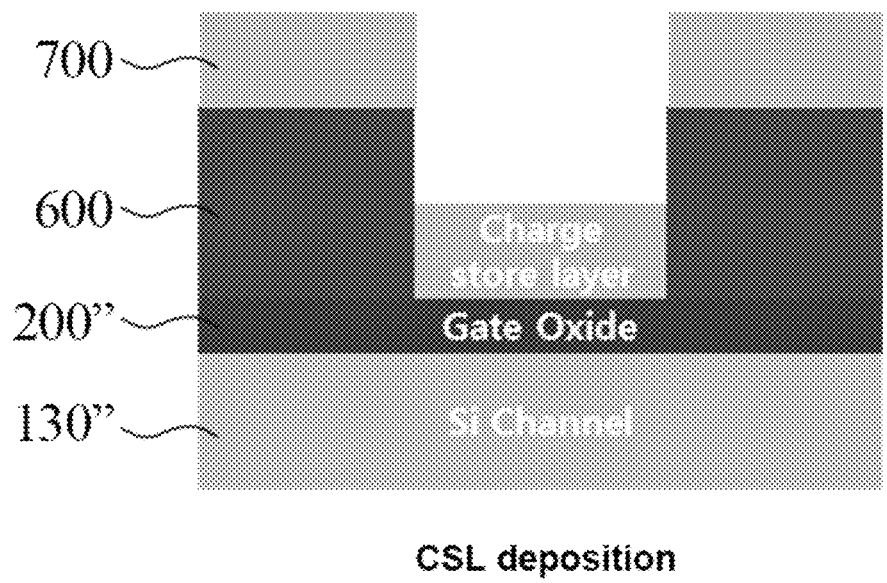
Figure 10D:
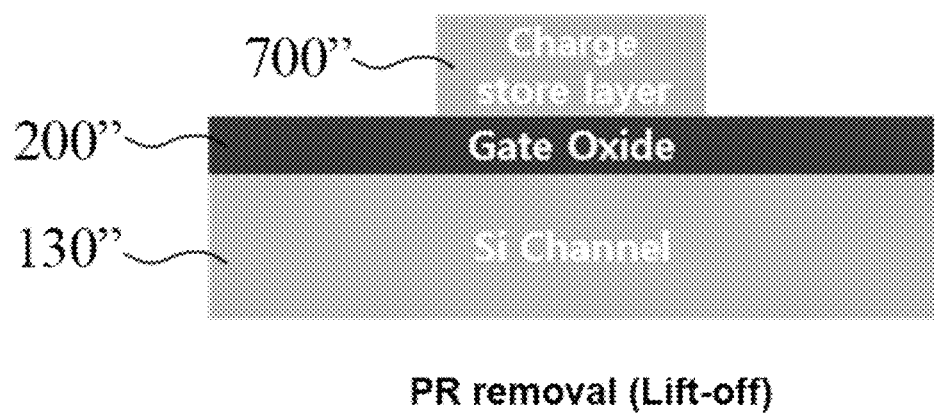
Figure 11:
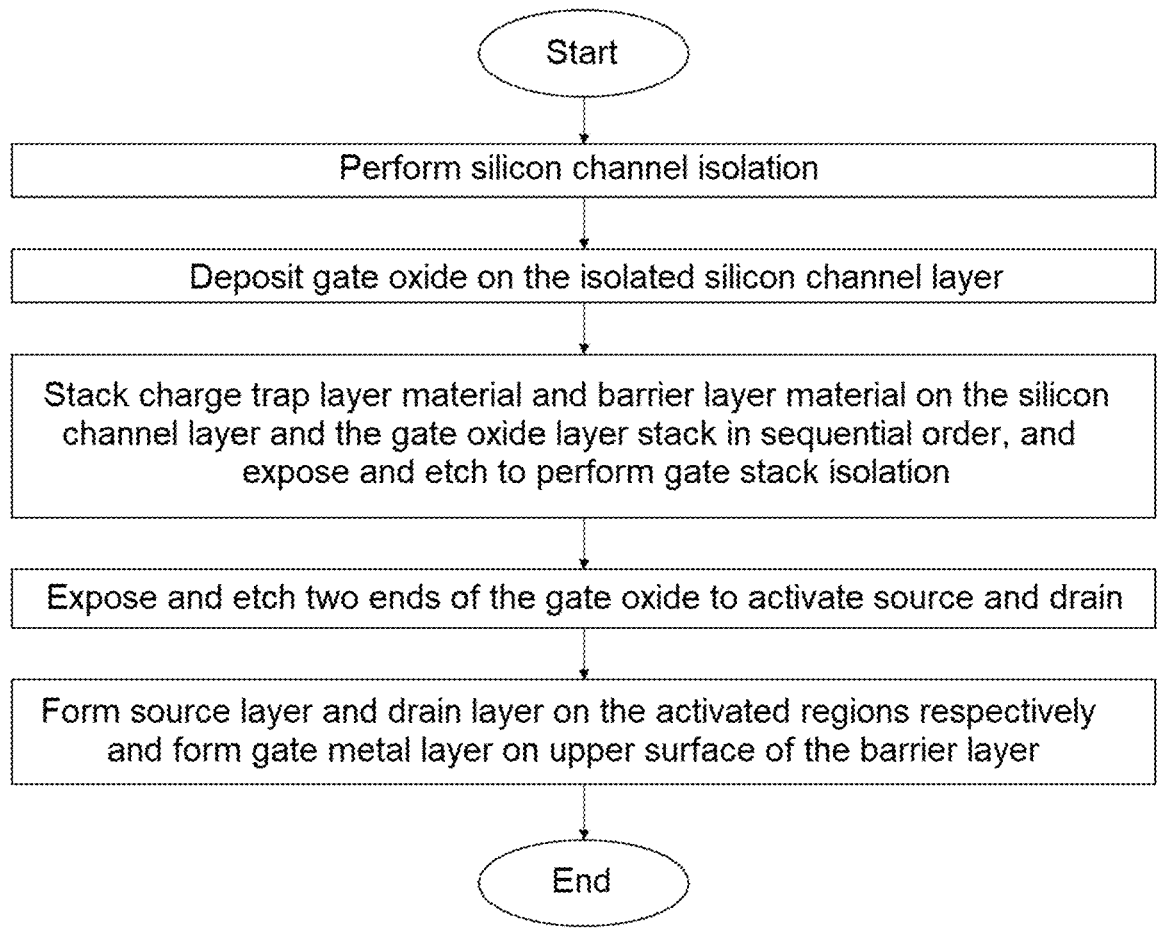
FIG. 11 is a flowchart for describing a process of a method for manufacturing a floating gate based 3-terminal analog synapse device according to a second embodiment of the present disclosure.

That is, as shown in FIGS. 10A and 10B, a photoresist pattern 600 is stacked on the silicon channel layer 130" and the gate oxide 200" stack, and as shown in FIGS. 10C and 10D, a charge trap layer 700 is deposited, and the photoresist pattern 600 and the charge trap layer 700 deposited thereon are removed together using the lift-off technique.

Through this, it is possible to achieve the patterning of a material that resists etching and eliminate the need for an etching process, thereby simplifying the manufacturing process and preventing film surface damage that may occur in the etching process.

Other embodiments of the present disclosure do not etch two ends after gate oxide deposition, and uses a method of etching only a region on which a selector device is placed, to complete a gate and a selector device stack, and etching the remaining region in which the selector device is absent. Hereinafter, its detailed description will be provided. In an embodiment of the present disclosure, the selector device may be a drain or source stack.

Figure 12:
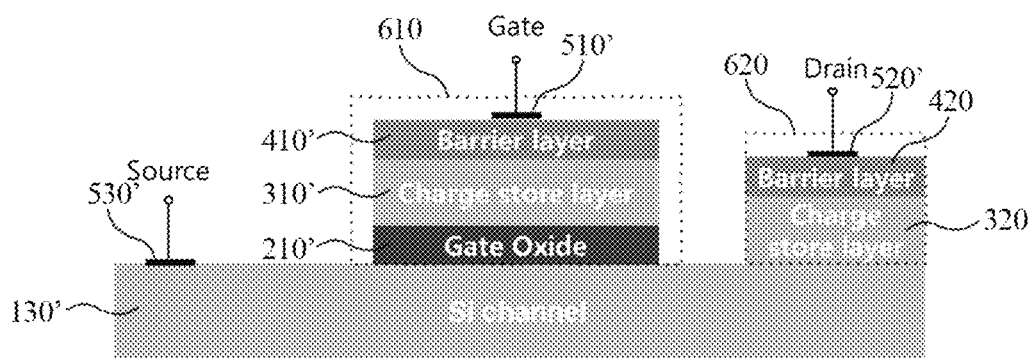
FIG. 12 is a cross-sectional view showing a floating gate based 3-terminal analog synapse device according to a third embodiment of the present disclosure.

FIG. 12 is a cross-sectional view showing a floating gate based 3-terminal analog synapse device according to a third embodiment of the present disclosure, and the floating gate based 3-terminal analog synapse device includes a silicon channel layer 130', a gate stack 610 and a drain stack 620 which is a selector device.

Figure 13:
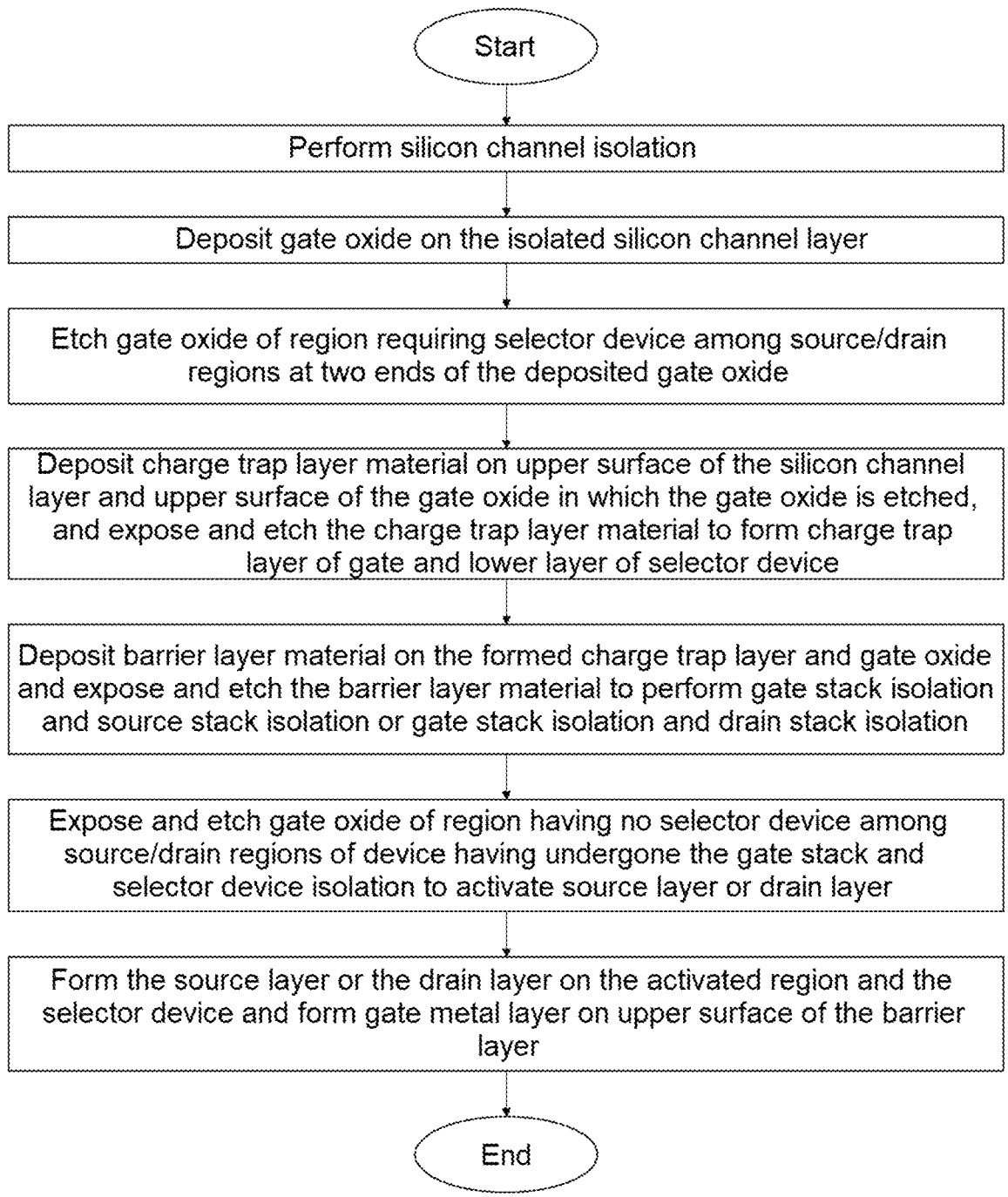
FIG. 13 is a flowchart for describing a process of a method for manufacturing a floating gate based 3-terminal analog synapse device according to a third embodiment of the present disclosure.

FIG. 13 is a flowchart for describing a process of a method for manufacturing a floating gate based 3-terminal analog synapse device according to the third embodiment of the present disclosure.

Although FIG. 12 shows the drain stack 620 as the selector device formed on the drain side, when the selector device is formed on the source side, the source stack may be formed as the selector device.

The configuration and function of the floating gate based 3-terminal analog synapse device according to the third embodiment of the present disclosure will be briefly described with reference to FIGS. 12 and 13 below.

This embodiment will be described taking the selector device formed as the drain stack 620 as an example.

The synapse device according to the third embodiment of the present disclosure includes a silicon channel layer 130', a gate stack 610 on the gate side at the center of the upper surface of the silicon channel layer 130', and a drain stack 620 on the drain side of the upper surface of the silicon channel layer 130'.

The gate stack 610 includes a gate oxide 210', a charge trap layer 310', a barrier layer 410' and a gate layer 510' stacked in that order, and the drain stack 620 includes a charge trap layer 320, a barrier layer 420 and a drain layer 520' stacked in that order.

As shown in FIG. 12, when the selector device is formed on the drain layer side among the two ends of the upper surface of the silicon channel layer 130', in the similar way to the process of FIG. 7F, a source layer 530' is formed on the upper surface of the silicon channel layer 130' in which the selector device is not formed, and a gate metal layer 510' is formed at the center of the upper surface of the barrier layer or the uppermost layer of the gate stack 610.

In contrast, as opposed to the process of FIG. 7F, on the drain layer side on which the selector device is formed, the drain layer 520' is formed on the upper surface of the barrier layer or the uppermost layer of the drain stack 620.

In the case of another embodiment in which the selector device is the source stack, in the similar way to the process of FIG. 7F, the drain layer 520' is formed at one end of the upper surface of the silicon channel layer 130' in which the selector device is not formed, and the gate metal layer 510' is formed at the center of the upper surface of the barrier layer or the uppermost layer of the gate stack 610.

In contrast, as opposed to the process of FIG. 7F, on the source layer side on which the selector device is formed, the source layer 530' is formed on the upper surface of the barrier layer or the uppermost layer of the source stack.

Through this, the 3-terminal analog synapse device according to the third embodiment of the present disclosure eliminates the need for a gate line for a separate additional transistor in each of a plurality of cells when fabricating in a crossbar array, thereby improving the integration of the device.

Figure 14:
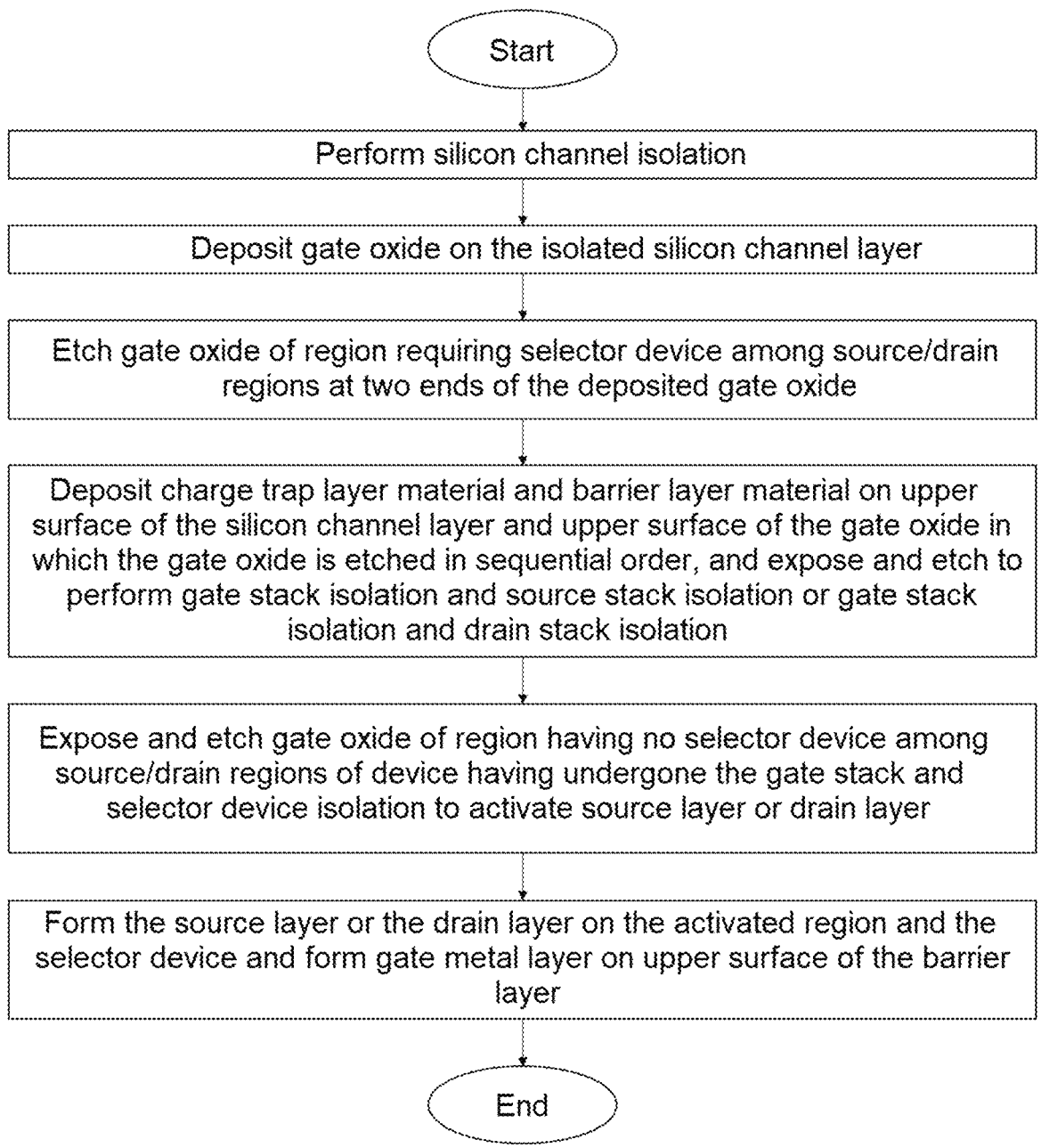
FIG. 14 is a flowchart for describing a process of a method for manufacturing a floating gate based 3-terminal analog synapse device according to a fourth embodiment of the present disclosure.

FIG. 14 is a flowchart for describing a process of a method for manufacturing a floating gate based 3-terminal analog synapse device according to a fourth embodiment of the present disclosure.

Figure 15:
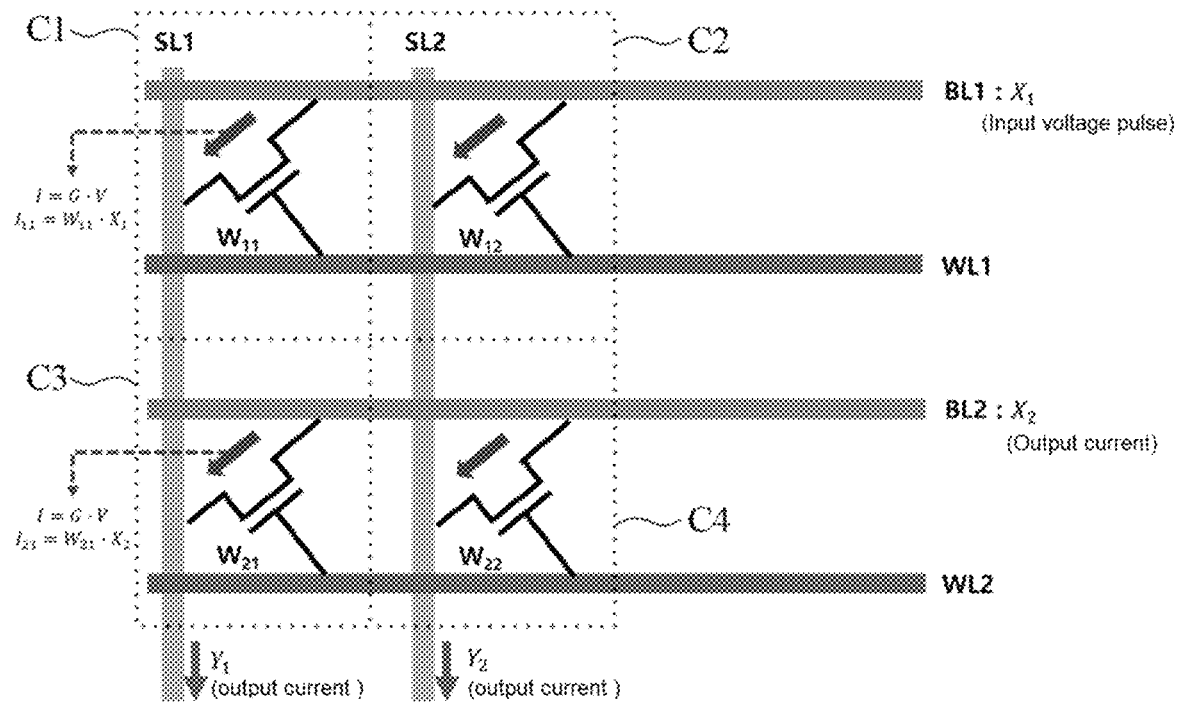
FIG. 15 is a configuration diagram for describing the operation of a plurality of cells fabricated as a crossbar array structure applying the synapse device according to third and fourth embodiments of the present disclosure shown in FIGS. 13 and 14.

FIG. 15 is a configuration diagram for describing the operation of a plurality of cells fabricated by applying the synapse device according to the third and fourth embodiments of the present disclosure shown in FIGS. 13 and 14 to a crossbar array structure.

Figure 16:
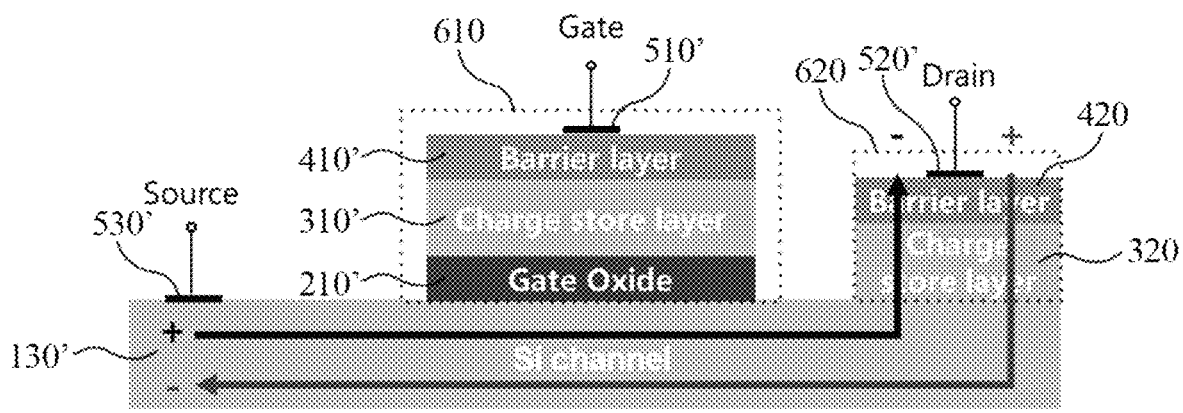
FIG. 16 is a cross-sectional view for describing the operation when a selector device is formed on the drain terminal side of the synapse device according to third and fourth embodiments of the present disclosure shown in FIGS. 13 and 14.

FIG. 16 is a cross-sectional view for describing the operation when the selector device is formed on the drain terminal side of the synapse device according to the third and fourth embodiments of the present disclosure shown in FIGS. 13 and 14.

Figure 17:
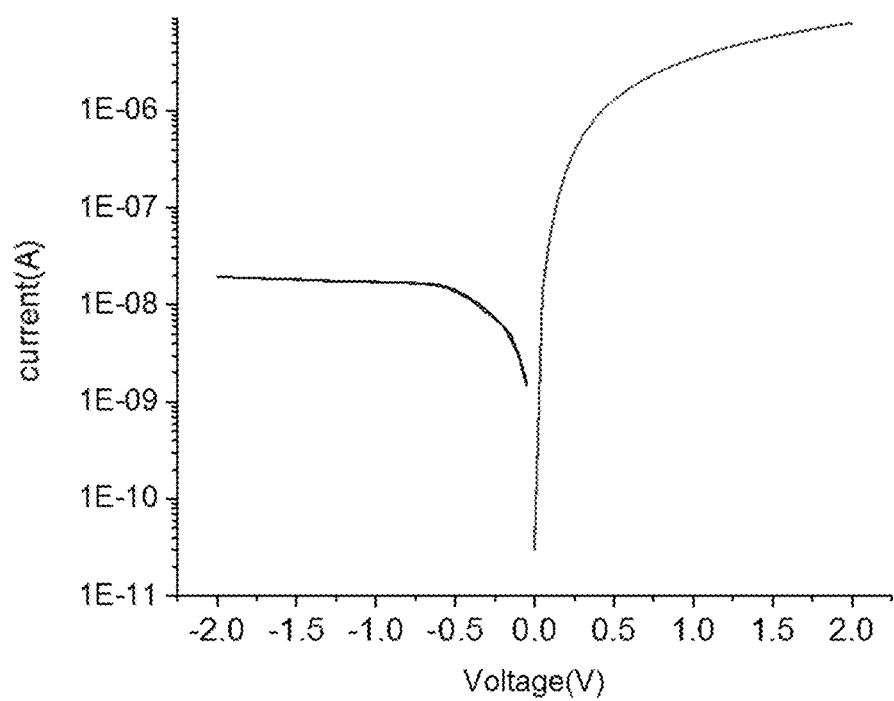
FIG. 17 is a graph for describing current-voltage characteristics of selector device when a selector device is formed on the drain terminal side of the synapse device according to third and fourth embodiments of the present disclosure shown in FIG. 15.

FIG. 17 is a graph for describing the current-voltage characteristics through the selector device when the selector device is formed on the drain terminal side of the synapse device according to the third and fourth embodiments of the present disclosure shown in FIG. 15.

The operation of the floating gate based 3-terminal analog synapse device according to the third and fourth embodiments of the present disclosure will be described in detail with reference to FIGS. 14 to 17 below.

Although FIG. 15 shows first and second bit lines BL1, BL2, first and second word lines WL1, WL2 and first and second source lines SL1, SL2, to depict the number of synapse devices set to four, i.e., four cells C1, C2, C3, C4 for convenience of understanding, the crossbar array actually includes a plurality of bit lines, word lines, source lines and synapse devices to form a plurality of cells.

As shown in FIG. 15, input voltage pulses X1, X2 applied to the first and second bit lines pass through the first and second cells C1, C2 and the third and fourth cells C3, C4, respectively, and are converted to electric currents by the conductance stored in each cell following the Ohm's law (I=G×V, G is conductance).

The electric currents of each cell are combined into the first or second source line connected in common according to the Kirchhoff's current law, and this becomes output current values Y1, Y2 of the first or second source line.

Through this, the synapse device according to the third and fourth embodiments of the present disclosure performs vector-matrix multiplication (VMM) such as the following equation 1.

The VMM is used in artificial neural network based machine learning and computation for other computing devices by using a synapse device array in which electric currents are output in combination into one source line corresponding to 'column' according to voltage applied to a plurality of bit lines corresponding to each 'row'.

In particular, in the case of an edge device which performs artificial intelligence computation in a local device itself without communication with a cloud server, limited power is supplied through a battery due to its isolated characteristics, so a device for high speed computation and data storage with low power and high efficiency is necessary, and the synapse device according to the third and fourth embodiments of the present disclosure may be applied to neural network based computation such as machine learning in the edge device.

$$(Y_1/Y_2) = (W_{11}W_{21}/W_{12}W_{22})(X_1/X_2) \qquad \text{[Equation 1]}$$

Here, $X_1$, $X_2$ denote voltages of the input pulses or pulse numbers applied to the first and second bit lines, respectively, $W_{11}$, $W_{12}$, $W_{21}$, $W_{22}$ denote the stored weights corresponding to the magnitude of conductance changing in the first to fourth cells, respectively, and $Y_1$, $Y_2$ denote the output current values of the first and second source lines, respectively.

In this instance, it is important to optimally control the conductance of each cell through write operation and erase operation for the required operation, and to this end, the characteristics of the synapse device such as linearity, on/off ratio, retention, endurance, device to device variation and cycle to cycle variation are important.

Additionally, to independently change the conductance of the synapse device of each cell in the write operation and erase operation, a process of accessing each cell is necessary.

That is, an example of write operation and erase operation using floating is as follows.

First, to update the first cell of FIG. 15, gate voltage Vg is applied to WL1, and floating is applied to the other word line.

In this instance, the cells $W_{21}$, $W_{22}$ that do not share WL1 are not updated.

Additionally, to prevent the other cell $W_{12}$ that shares WL1 from being updated, ground voltage GND is applied to SL1, and floating is applied to all the source lines SL except SL1 and all BL.

In this case, as the bottom channel floats in the cell $W_{12}$, updating is prevented by reducing the influence of the electric field by the gate voltage.

However, updating is performed in $W_{11}$ using a potential difference between SL1 and GND, and the floating of BL1 is not affected by the selector device formed on the drain side and does not affect the other cell.

As another method for optimally controlling the conductance of each cell through write operation and erase operation, below is a description of an example of a method for cancelling out the potential difference by applying voltage to other SL and BL in the write operation and erase operation using the operation of the selector device.

In this example, write voltage Vwrite is set to a positive voltage, and erase voltage Verase is set to a negative voltage.

First, in the write operation, to update the first cell, GND is applied to SL1, Vwrite is applied to WL1, and Vwrite/2 is applied to other WL.

In this instance, to prevent the other cell W12 that shares WL1 with W11 from being updated, Vwrite/2 is applied to all SL except SL1.

Additionally, the other cell W12 that shares WL1 with W11 and the other cell W21 that shares SL1 with W11 are not updated due to the potential difference of just Vwrite/2 between gate-channel.

The cells that do not share WL or SL with W11 are not updated by applying Vwrite/2 to SL and WL.

In the case of BL, GND is applied to prevent the other line from being affected by the selector device.

Subsequently, in the erase operation, to update W11, GND is applied to SL1, Verase is applied to WL1, and Verase/2 is applied to the other WL.

In this instance, to prevent the other cell W12 that share WL1 with W11 from being updated, Verase/2 is applied to all SL except SL1, and the other cell W12 that shares WL1 and the other cell W21 that shares SL1 are not updated due to the potential difference of only Verase/2 between gate-channel.

The cells that do not share WL, SL with W11 are not updated since Verase/2 is applied to both SL and WL, and thus a potential difference does not occur.

In the case of BL, to prevent the other line from being affected by the selector device, voltage having its absolute value of Verase/2 or more is applied.

The above-described example uses the presence or absence of updates based on nonlinearity of a change in conductance with a change in the applied potential difference, and voltage applied to each line may change, and the potential difference may use V/3 or any other value than V/2.

In FIG. 16, when the selector device is formed as the drain stack 620 and a positive voltage (2 V) is applied between drain terminal—source terminal (in red), as shown in FIG. 17, the current level sharply increases in the voltage range of about 0~0.5 V, and reaches saturation with the electric current of about 1E-06 A in the voltage range of about 1.0~1.5 V.

In contrast, when a negative voltage (−2 V) is applied between drain terminal-source terminal (in black), as shown in FIG. 13, the level of electric current in saturated state with the electric current of about 1E-08 A in the voltage range of about −1.0~−0.5 V sharply decreases in the voltage range of about −0.5~0 V.

It can be seen that the intensity of the current exhibits a difference of about 102 times in the voltage range of about −0.5~0.5 V in which the operation with a sharp increase in the current level and the operation with a sharp reduction in the current level are switched.

Using the current-voltage characteristics properly, the operation is normally performed by reading data stored in the charge store layer by the desired flow of current according to the applied voltage in the read operation, while in the write operation and erase operation, the sneak path flow of current generated by reverse voltage is interrupted, thereby preventing the performance degradation of the array operation such as interference of neighboring cells.

That is, the selector device formed as the drain stack 620 is used to prevent an unintentional operation caused by the flow of current due to sneak path between adjacent synapse devices fabricated in a crossbar array.

In the case of the device according to the first and second embodiments of the present disclosure, an additional transistor is connected to each device to form an array as shown in FIG. 15, in order to perform VMM as described above.

The method for manufacturing a floating gate based 3-terminal analog synapse device according to the third and fourth embodiments of the present disclosure will be briefly described with reference to FIGS. 7A, 7B, 12, 13 and 14 below.

Si channel isolation is performed (S210).

In this instance, the Si channel isolation may use a mesa structure and its similar structure.

The gate oxide 200 is deposited on the buried oxide layer 120 and the silicon channel layer 130 that form the mesa structure (S220).

Of the source/drain regions at the two ends of the gate oxide 200 deposited in the step S220, a region requiring the selector device is etched (S230).

The charge trap layer and the barrier layer are deposited on the upper surface of the silicon channel layer 130 in which the gate oxide 200 is etched in the step S230 and the upper surface of the gate oxide 200 in a sequential order (S240).

The two ends of the barrier layer and the charge trap layer are patterned (photolithography) and etched at the same time, leaving a region in which the source layer 530' or the drain layer 520' is to be formed, to perform the gate stack 610 isolation and source stack isolation or the gate stack 610 isolation and the drain stack 620 isolation (S250).

The activation of the drain layer 520' or the source layer 530' having no selector device is performed on the device having the source stack or the drain stack 620 isolated in the step S250 (S260).

The source layer 530' or the drain layer 520' is formed on the region activated in the step S260 and the selector device, and the gate metal layer 510' is formed on the upper surface of the barrier layer 410' (S270).

Meanwhile, instead of depositing the charge trap layer and the barrier layer in a sequential order and patterning (photolithography) and etching the two ends at the same time in the steps S240 and S250, the third embodiment may include depositing the charge trap layer (S235), patterning (photolithography) and etching (S245), and then depositing the barrier layer (S255) and patterning (photolithography) and etching (S265) as shown in FIG. 13.

Through these individual processes, it is possible to form the charge trap layer and the barrier layer in different sizes.

For example, when the charge trap layer is larger in size than the barrier layer, it is possible to stack and form a different material layer on the upper surface of the charge trap layer.

The method for manufacturing a floating gate based 3-terminal analog synapse device according to the third and fourth embodiments of the present disclosure will be described with reference to FIGS. 7A to 17 below, in comparison with the first and second embodiments of the present disclosure.

The 3-terminal analog synapse device according to the third and fourth embodiments of the present disclosure is manufactured with an addition of a process of etching a region requiring the selector device among the source/drain regions at the two ends of the gate oxide 200 deposited on the silicon channel layer 130 before performing the process of FIG. 7C after forming the silicon channel layer in FIG. 7B according to the first and second embodiments of the present disclosure.

Subsequently, the charge trap layer and the barrier layer are deposited above the upper surface of the silicon channel layer 130 and the upper surface of the gate oxide 200 in a sequential order in the same way as the process of FIG. 7C.

Additionally, in the same way as the process of FIG. 7D, the two ends of the barrier layer and the charge trap layer are etched at the same time using reactive-ion etching, leaving a region in which the source layer 530' or the drain layer 520' is to be formed, to perform the gate stack 610 isolation and the source stack isolation or the gate stack 610 isolation and the drain stack 620 isolation.

In this instance, in the source stack isolation and the drain stack isolation, in the same way as the gate stack 610 isolation, instead of etching the two ends at the same time after depositing the charge trap layer and the barrier layer in a sequential order, the charge trap layer may be deposited and etched, and then the barrier layer may be deposited and etched.

Through these individual process, it is possible to form the charge trap layer and the barrier layer in different sizes.

In this instance, the source stack or the drain stack 620 is used as a selector device that facilitates the write operation and erase operation for each of the plurality of cells that constitute the synapse device.

As described above, the present disclosure provides a floating gate based 3-terminal analog synapse device capable of read operation, write operation and erase operation with low power by controlling the operating current range by adjusting the doping concentration of the source-drain channel, and a manufacturing method thereof.

Additionally, there is provided the floating gate based 3-terminal analog synapse device which is compatible with a complementary metal-oxide-semiconductor (CMOS) device using the existing CMOS fabrication process, is suitable for mass production, and when integrated into a chip with CMOS device based peripheral circuits, reduces the size and power consumption of the entire neural network based computing system and provides high computation processing efficiency, thereby achieving efficient machine learning and deep learning computation in an edge device.

Additionally, there is provided a floating gate based 3-terminal analog synapse device in which the charge trap layer and the barrier layer are formed in different sizes by performing each of deposition and etching of the two layers through individual processes, and the lift-off technique is applied instead of the etching process to simplify the manufacturing process.

Through this, according to the present disclosure, it is possible to ensure carrier injection and removal according to gate voltage, leading to a linear change of electric current in the channel between source and drain, and operations do not rely on electrons moving through the silicon oxide layer between gate and channel, so there is no degradation of the silicon oxide layer, thereby improving durability and stability of the device.

Additionally, as carrier injection and removal are done all over the charge trap layer, the operational stability is improved compared to the existing filament based memristor synapse device.

Additionally, when configured using a system on chip for computing to imitate neural networks, it is possible to reduce the power consumption compared to the existing CMOS based neural network processing device, and thus can be used in an edge device.

Additionally, as data storage is performed in a single device, high integration is achieved, and mass production is possible by the existing CMOS based manufacturing process, thereby achieving cost savings, and it can be used to build a cloud server for training neural networks.

Additionally, as each of deposition and etching of the charge trap layer and the barrier layer is performed through individual processes, it is possible to form the two layers in different sizes.

Additionally, the lift-off technique can be applied to the silicon channel layer and the gate oxide stack, thereby simplifying the manufacturing process and preventing film surface damage that may occur in the etching process.

While the present disclosure has been described with reference to the embodiments illustrated in the figures, the embodiments are merely examples, and it will be understood by those skilled in the art that various changes in form and other embodiments equivalent thereto can be performed. Therefore, the technical scope of the disclosure is defined by the technical idea of the appended claims The drawings and the forgoing description gave examples of the present invention. The scope of the present invention, however, is by no means limited by these specific examples.

Numerous variations, whether explicitly given in the specification or not, such as differences in structure, dimension, and use of material, are possible. The scope of the invention is at least as broad as given by the following claims.

Detailed Description of Main Elements

130, 130', 130": Silicon channel layer
210, 210', 200', 200": Gate oxide
310, 310', 320, 300", 700, 700": Charge trap layer
410, 410', 420, 400', 400": Barrier layer
510, 510': Gate metal layer
520, 520': Drain layer
530, 530': Source layer
610: Gate stack
620: Selector device

What is claimed is:

1. A floating gate based 3-terminal analog synapse device, comprising:
    a silicon channel layer;
    a gate oxide deposited on the silicon channel layer;
    a charge trap layer deposited on the gate oxide, wherein charges are injected into the charge trap layer;
    a barrier layer deposited on the charge trap layer, and having lower electron affinity than electron affinity of a material of the charge trap layer; and a gate metal layer deposited on an upper surface of the barrier layer, wherein a gate voltage is applied to the gate metal layer, wherein each of a potential barrier height between the gate metal layer and the barrier layer and a potential barrier height between the barrier layer and the charge trap layer has a lower barrier than 2 eV.

2. The floating gate based 3-terminal analog synapse device of claim 1, wherein in case that a negative voltage is applied to the gate metal layer, the charges are injected into the charge trap layer, wherein in case that a positive voltage is applied to the gate metal layer, the charges are removed from the charge trap layer.

3. The floating gate based 3-terminal analog synapse device of claim 2, wherein the floating gate based 3-terminal analog synapse device comprising:

a source including a source electrode formed in a first region on the silicon channel layer, without the gate oxide layer on silicon channel layer; and a drain including a drain electrode formed in a second region on the silicon channel layer, without the gate oxide layer on silicon channel layer.

4. The floating gate based 3-terminal analog synapse device of claim 2, wherein the gate oxide is stacked using at least one material selected from the group consisting of Si oxide, Si nitride, SiOxNy, Hf oxide, and Ta oxide by at least one method selected from thermal oxidation, chemical vapor deposition (CVD), and atomic layer deposition (ALD).

5. The floating gate based 3-terminal analog synapse device of claim 1, wherein the floating gate based 3-terminal analog synapse device comprising:

a source including a source electrode formed in a first region on the silicon channel layer, without the gate oxide layer on silicon channel layer; and a drain including a drain electrode formed in a second region on the silicon channel layer, without the gate oxide layer on silicon channel layer.

6. The floating gate based 3-terminal analog synapse device of claim 5, wherein a conductance change is read by determining a current value between source-drain according to an amount of accumulated charges of the charge trap layer.

7. The floating gate based 3-terminal analog synapse device of claim 6, wherein in case of a write operation or erase operation of the synapse device, charge injection or removal is done from the gate metal layer to the charge trap layer using a potential difference between the channel between source-drain and the gate metal layer.

8. The floating gate based 3-terminal analog synapse device of claim 6, wherein in case of a read operation of the synapse device, after grounding or floating the gate metal layer, an output current is read using the voltage applied between source-drain and the read change in conductance.

9. The floating gate based 3-terminal analog synapse device of claim 5, wherein a selector device is formed on any one of the first region or the second region, and the selector device includes a charge trap layer; a barrier layer; and a source or drain electrode.

10. A floating gate based 3-terminal analog synapse device array, comprising a plurality of cells, wherein in case that the synapse device of claim 9 is manufactured in an array, the selector device interrupts a sneak path flow of current in neighboring synapse devices generated by reverse voltage.

11. The floating gate based 3-terminal analog synapse device array of claim 10, wherein input voltage pulses applied to a plurality of bit lines of the synapse device array pass through each of the plurality of cells having a gate terminal connected to a plurality of word lines, and are converted into electric currents flowing in a plurality of source lines perpendicular to the plurality of bit lines by conductance stored in each cell.

12. The floating gate based 3-terminal analog synapse device array of claim 11, wherein the converted electric currents pass through cells connected to a common source line among the plurality of cells, and are combined into an output current value of the common source line to perform vector-matrix multiplication.

13. The floating gate based 3-terminal analog synapse device of claim 1, wherein the silicon channel layer is isolated.

14. The floating gate based 3-terminal analog synapse device of claim 1, wherein the gate oxide is stacked using at least one material selected from the group consisting of Si oxide, Si nitride, SiOxNy, Hf oxide, and Ta oxide by at least one method selected from thermal oxidation, chemical vapor deposition (CVD), and atomic layer deposition (ALD).

15. The floating gate based 3-terminal analog synapse device of claim 1, wherein the charge trap layer includes at least one selected from the group consisting of W oxide, Mo oxide, In oxide, V oxide, and ITO.

16. The floating gate based 3-terminal analog synapse device of claim 1, wherein the barrier layer includes at least one selected from the group consisting of amorphous silicon, hydrogenated amorphous silicon, Si oxide, Ti oxide, Ta oxide, Hf oxide, Si nitride, SiOxNy, Al oxide, Zr oxide, Zn oxide, Nb oxide, and FTO.

17. The floating gate based 3-terminal analog synapse device of claim 1, wherein the floating gate based 3-terminal analog synapse device comprising:

a source including a source electrode formed in a first region on the silicon channel layer, without the gate oxide layer on silicon channel layer; and a drain including a drain electrode formed in a second region on the silicon channel layer, without the gate oxide layer on silicon channel layer.

18. The floating gate based 3-terminal analog synapse device of claim 1, wherein the gate oxide is stacked using at least one material selected from the group consisting of Si oxide, Si nitride, SiOxNy, Hf oxide, and Ta oxide by at least one method selected from thermal oxidation, chemical vapor deposition (CVD), and atomic layer deposition (ALD).

19. The floating gate based 3-terminal analog synapse device of claim 1, wherein the charge trap layer includes at least one selected from the group consisting of W oxide, Mo oxide, In oxide, V oxide, and ITO.

\* \* \* \* \*